(12) United States Patent
Tamamori et al.

(10) Patent No.: US 8,337,712 B2
(45) Date of Patent: Dec. 25, 2012

(54) METHOD FOR FORMING ETCHING MASK, METHOD FOR FABRICATING THREE-DIMENSIONAL STRUCTURE AND METHOD FOR FABRICATING THREE-DIMENSIONAL PHOTONIC CRYSTALLINE LASER DEVICE

(75) Inventors: Kenji Tamamori, Ebina (JP); Masahiko Okunuki, Akiruno (JP); Shinan Wang, Kashiwa (JP); Taiko Motoi, Atsugi (JP); Haruhito Ono, Minamiashigara (JP); Toshiaki Aiba, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 1260 days.

(21) Appl. No.: 12/120,461

(22) Filed: May 14, 2008

(65) Prior Publication Data

US 2008/0283493 A1 Nov. 20, 2008

(30) Foreign Application Priority Data

May 15, 2007 (JP) ................................. 2007-128871
Apr. 8, 2008 (JP) ................................. 2008-099991

(51) Int. Cl.
*B29D 11/00* (2006.01)
*B44C 1/22* (2006.01)

(52) U.S. Cl. ............................... 216/26; 216/47; 216/51

(58) Field of Classification Search ........................ None
See application file for complete search history.

(56) References Cited

U.S. PATENT DOCUMENTS

| | | | |
|---|---|---|---|
| 5,201,681 A | 4/1993 | Okunuki et al. ................ 445/24 |
| 5,236,547 A | 8/1993 | Takahashi et al. ............ 156/628 |
| 5,285,079 A | 2/1994 | Tsukamoto et al. ............ 257/10 |
| 5,335,240 A | 8/1994 | Ho et al. ........................... 372/39 |
| 5,361,015 A | 11/1994 | Okunuki et al. ............... 313/309 |
| 5,798,529 A * | 8/1998 | Wagner ..................... 250/492.21 |
| 5,814,832 A | 9/1998 | Takeda et al. .................... 257/10 |
| 7,611,810 B2 * | 11/2009 | Okunuki et al. ................ 430/30 |
| 7,700,390 B2 * | 4/2010 | Wang et al. ...................... 438/31 |
| 7,704,861 B2 * | 4/2010 | Kaneko et al. ................ 438/487 |
| 7,727,410 B2 * | 6/2010 | Wang et al. ....................... 216/24 |
| 7,902,637 B2 * | 3/2011 | Motoi et al. ................... 257/618 |
| 8,084,365 B2 * | 12/2011 | Motoi et al. .................. 438/700 |
| 8,110,322 B2 * | 2/2012 | Sano et al. ......................... 430/5 |
| 2003/0020060 A1 * | 1/2003 | Iwasaki et al. ................... 257/13 |
| 2005/0207717 A1 | 9/2005 | Takagi et al. ................... 385/129 |
| 2007/0196066 A1 * | 8/2007 | Wang et al. .................... 385/129 |
| 2007/0253660 A1 | 11/2007 | Wang et al. ........................ 385/5 |
| 2008/0067437 A1 * | 3/2008 | Okunuki et al. ......... 250/492.21 |
| 2008/0283487 A1 * | 11/2008 | Wang et al. ........................ 216/2 |
| 2008/0286892 A1 * | 11/2008 | Wang et al. ..................... 438/31 |

(Continued)

FOREIGN PATENT DOCUMENTS

JP H05-029283 2/1993

(Continued)

*Primary Examiner* — Allan Olsen

(74) *Attorney, Agent, or Firm* — Fitzpatrick, Cella, Harper & Scinto

(57) ABSTRACT

A method for forming an etching mask comprises irradiating a focused ion beam onto a surface of a substrate and forming an etching mask used for oblique etching including an ion containing portion in the irradiated region. A method for fabricating a three-dimensional structure comprises preparing a substrate, irradiating a focused ion beam onto a surface of the substrate and forming an etching mask including an ion-containing portion in the irradiated region, and dry-etching the substrate from a diagonal direction using the etching mask and forming a plurality of holes.

5 Claims, 23 Drawing Sheets

U.S. PATENT DOCUMENTS

| | | | |
|---|---|---|---|
| 2008/0298744 A1* | 12/2008 | Wang et al. | 385/27 |
| 2009/0315153 A1* | 12/2009 | Motoi et al. | 257/618 |
| 2009/0321261 A1* | 12/2009 | Vlahovic et al. | 204/545 |
| 2010/0143828 A1* | 6/2010 | Sano et al. | 430/5 |
| 2011/0027998 A1* | 2/2011 | Motoi et al. | 438/702 |

FOREIGN PATENT DOCUMENTS

JP  2004-219688  8/2004

* cited by examiner

600

601

602
601

602
603

METHOD FOR FORMING ETCHING MASK, METHOD FOR FABRICATING THREE-DIMENSIONAL STRUCTURE AND METHOD FOR FABRICATING THREE-DIMENSIONAL PHOTONIC CRYSTALLINE LASER DEVICE

BACKGROUND OF THE INVENTION

1. Field of the Invention

The present invention relates to a method for forming an oblique-etching mask and a method for fabricating a three-dimensional structure with a mask formed according to the formation method. Further, the present invention relates to a method for fabricating a laser device utilizing a three-dimensional photonic crystal.

2. Description of the Related Art

Three-dimensional processing of forming and processing a diagonal hole or a trench pattern in a substrate is a processing method that can improve flexibility of device design and productivity of a three-dimensional structure. In dry-etching such an oblique pattern, if the dry-etching is performed using an etching mask formed approximately perpendicularly to a substrate, an end portion of a mask pattern is shaded by a mask shadowing effect, which makes it difficult to form an oblique pattern shape with high precision. Accordingly, to process the oblique pattern shape with high precision, it is necessary to process the etching mask into such a shape as to reduce the shadowing effect.

Accordingly, Japanese Patent Application Laid-Open No. H05-029283 has proposed an oblique-etching method of forming an oblique trench in a material to be etched by dry etching. In this method, as illustrated in FIGS. 20A to 20C, first, a first etching stopper layer 1117b including a first mask member showing thermal flowability is formed on a material 1111 to be etched, with a portion serving as an opening of a trench sandwiched therebetween. On a layer 1117a including the first mask member, there is formed a second etching stopper layer layered with a layer 1118a including a second mask member having lower thermal flowability than the first mask member, as illustrated in FIG. 20A. Next, by heating the whole, the first etching stopper layer 1117b has flowability to incline a surface thereof, form a taper 1117c as illustrated in FIG. 20B and to perform dry-etching using the taper as a mask as illustrated in FIG. 20C.

On the other hand, conventionally, there has been known a pattern formation technology using ion beam injection as a thin-film processing technology. As such a thin-film processing technology, U.S. Pat. No. 5,236,547 has proposed a method for processing a thin film by the following steps of ion beam injection and applying dry etching to a material to be etched. FIGS. 21A and 21B illustrate a step pattern formation process in thin-film processing disclosed in U.S. Pat. No. 5,236,547 described above. In an ion beam injection process illustrated in FIG. 21A, an injection position of ion beams concentrated on the material to be etched is changed. At the same time, at least one of acceleration voltage, atom type of ion and valence of ion is changed, and ion injection is performed to form an ion concentration peak region in a depth direction of the material to be etched. In FIG. 21A, a region indicated in black is an ion injection region. In a dry etching process illustrated in FIG. 21B, the material to be etched is dry-etched with etching gas for forming ions and an etching inhibition region in an ion concentration peak region of the material to be etched. According to these processes, thin-film processing is implemented. The ion injection region, having higher etching resistance than other regions, is formed with a height difference as illustrated in FIG. 21B. (The reference characters are explained as follows: a film 1212, a substrate 1211, ions 1213 implanted at portions 1212a, an etchant gas 1214 the resulting step-difference pattern 1212b.)

In three-dimensional photonic crystal, as one example of typical structures thereof, there has been known a woodpile structure (or rod-pile structure) disclosed in U.S. Pat. No. 5,335,240. A woodpile structure in the three-dimensional photonic crystal has such a structure as illustrated in FIG. 22. In FIG. 22, a woodpile structure in a three-dimensional structure has a plurality of stripe layers arranged by disposing a plurality of rods 1330 in parallel to each other and periodically in a predetermined in-plane period, which are layered in order as illustrated. Specifically, the three-dimensional structure includes the following four stripe layers: a first stripe layer arranged by disposing a plurality of rods in parallel to each other and periodically in a predetermined in-plane period; a second stripe layer layered on the first stripe layer so as to be orthogonal to the respective rods belonging to the first stripe layer; a third stripe layer layered on the second stripe layer so as to be parallel to the respective rods belonging to the first stripe layer and to be shifted therefrom by one half of an in-plane period; and a fourth stripe layer on the third stripe layer layered so as to be parallel to the respective rods belonging to the second stripe layer and to be shifted therefrom by one half of an in-plane period. The four stripe layers are taken as one set and a plurality of sets thereof are layered in order, so as to form a three-dimensional structure.

In addition, U.S. Patent Publication No. 2005/0207717 has proposed a joint rod type three-dimensional photonic crystalline structure in which a joint larger than an area of an intersection region is disposed at a position corresponding to an intersection of woodpile structure rods in order to provide a complete photonic band gap in a wider wavelength region. Further, Japanese Patent Application Laid-Open No. 2004-219688 has disclosed a thermal adhesion method for different types of members. Next, a process thereof will be described. As illustrated in FIGS. 23A to 23F, a main constitutional layer 1422 of three-dimensional photonic crystal and a light-emitting layer 1424 are tack-welded at 220° C. (FIGS. 23A and 23B). A substrate 1423 on which the light-emitting layer 1424 is placed is thinned by mechanical polishing, as illustrated in FIG. 23C. The main constitutional layer 1422 and the light-emitting layer 1424 are regular-welded at 525° C., as illustrated in FIG. 23D. Then, the substrate 1423 is completely removed by etching process using hydrochloric acid, as illustrated in FIG. 23E. As a result, there is formed three-dimensional photonic crystal in which the light-emitting layer exists on a surface thereof, as illustrated in FIG. 23F.

SUMMARY OF THE INVENTION

However, an oblique etching method as described in Japanese Patent Application Laid-Open No. H05-029283, one of conventional examples, which cannot facilitate control of etching mask oblique shape. Thus, a pattern shape for forming an oblique hole is difficult to control. A conventional thin-film processing method as disclosed in U.S. Pat. No. 5,236,547 can process a material to be etched in a depth direction. However, the processing method is for a two-dimensional structure and does not use a technique for a sacrificial layer or the like, which can process only a portion that is visible from the top face. It has not been solved that such a technology enables preparation of a three-dimensional photonic crystal having a complicated structure like a woodpile.

In view of the foregoing problems, it is an object of the present invention to provide a method for forming an etching mask, a method for fabricating a three-dimensional structure and a method for fabricating a three-dimensional photonic crystalline laser device, capable of facilitating control of a pattern shape for forming an oblique hole in processing by oblique etching.

The present invention provides a method for forming an etching mask, a method for fabricating a three-dimensional structure and a method for fabricating three-dimensional photonic crystalline laser device. A method for forming an etching mask according to the present invention includes irradiating a focused ion beam to a surface of a substrate and forming an etching mask used for oblique etching including an ion containing portion in the irradiated region. A method for fabricating a three-dimensional structure according to the present invention includes: preparing a substrate; irradiating the focused ion beam onto a surface of the substrate and forming an etching mask including an ion-containing portion in the irradiated region; and dry-etching the substrate from a diagonal direction using the etching mask and forming a plurality of holes. In addition, a method for fabricating a three-dimensional structure according to the present invention includes: preparing a substrate; irradiating the focused ion beam onto a surface of the substrate and forming a first etching mask including an ion-containing portion in the irradiated region; dry-etching the substrate from a diagonal direction using the first etching mask and forming a first plurality of holes on the substrate; irradiating the focused ion beam onto a surface of the substrate and forming a second etching mask including an ion-containing portion in the irradiated region; and dry-etching the substrate so as to intersect with a depth direction of the first plurality of holes using the second etching mask and forming a second plurality of holes. Moreover, a method for fabricating three-dimensional photonic crystalline laser device according to the present invention includes: forming a dielectric film constituting a three-dimensional photonic crystal on a substrate; forming a three-dimensional photonic crystalline structure by performing etching at least two times from a diagonal direction to the normal to the surface of the substrate; forming a structural defect portion within a three-dimensional photonic crystalline structure; and forming an active portion exhibiting a light-emitting action at the defect portion.

The present invention provides a method for forming an etching mask, a method for fabricating a three-dimensional structure and a method for fabricating a three-dimensional structure including the mask formed according to the formation method, capable of facilitating control of a pattern shape for forming an oblique hole in processing by oblique etching. Furthermore, the present invention, enabling formation of an active portion of a three-dimensional photonic crystalline laser device without taking steps of junction and removal of a support substrate, provides a fabricating method capable of facilitating preparation of the three-dimensional photonic crystalline laser device.

Other features and advantages of the present invention will be apparent from the following description taken in conjunction with the accompanying drawings, in which like reference characters designate the same or similar parts throughout the figures thereof.

DESCRIPTION OF THE EMBODIMENTS

Preferred embodiments of the present invention will now be described in detail in accordance with the accompanying drawings.

Now, description will be made on embodiments of a method for forming an etching mask used for oblique etching according to the present invention and embodiments of a method for forming a three-dimensional structure in which the etching mask is used as a mask.

First Embodiment

Figure 1:
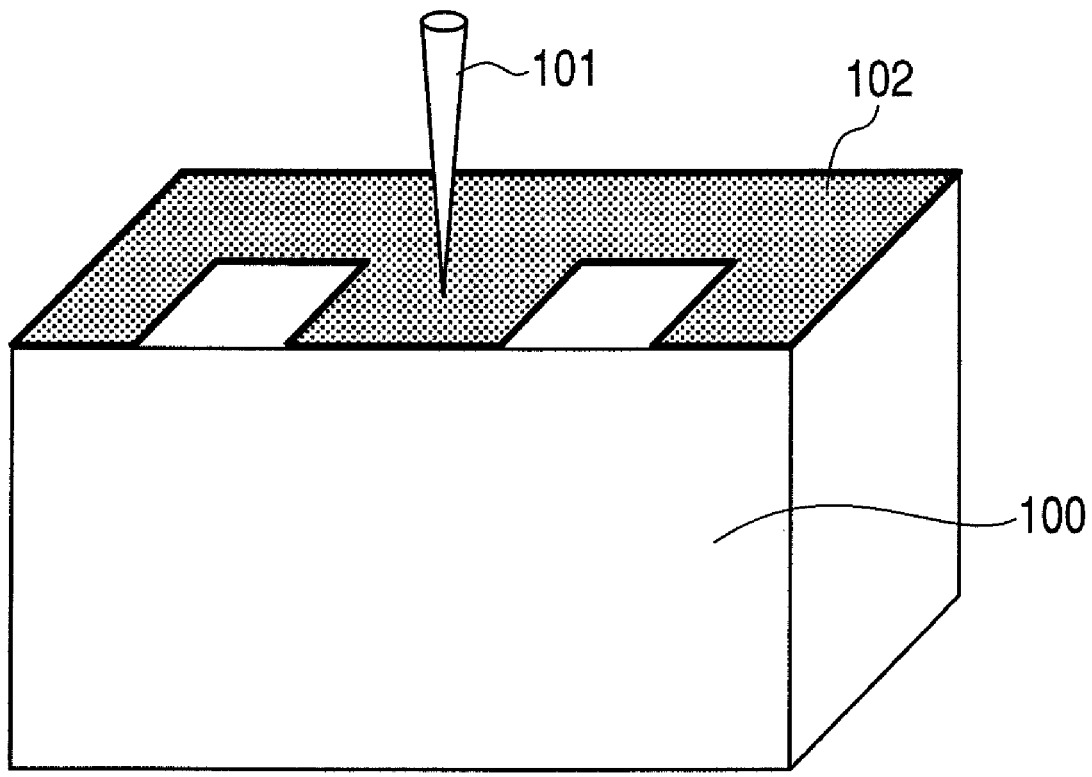
FIG. 1 is a view illustrating a method for forming an etching mask used for oblique etching according to a first embodiment of the present invention.

In the first embodiment, a method for forming an etching mask used for oblique etching to which the present invention is applied will be described below. FIG. 1 illustrates a method for forming an etching mask according to the present embodiment. In FIG. 1, reference character 100 denotes a substrate, reference character 101 is a focused ion beam (FIB) and reference character 102 denotes an etching mask. As illustrated in FIG. 1, by irradiating a silicon substrate 100 with the focused ion beam while scanning it in an in-plane direction of the substrate, an etching mask 102 including an ion-containing portion to be used for oblique etching is formed on the silicon substrate 100. By irradiating a surface of the substrate with the focused ion beam in this way, an etching mask including an ion-containing portion can be formed in the irradiated region.

Further description will be made with the focused ion beam (FIB) using gallium (Ga) ions used as the focused ion beam. By irradiating the substrate surface with the focused ion beam (FIB) 101 using gallium (Ga) ions while scanning in an in-plane direction of the substrate, an etching mask 102 including the Ga-containing portion to be used for oblique etching is formed on a silicon substrate. In such an etching mask including a Ga-containing portion, when fluorine gas is used for dry etching, Ga chemically reacts with fluorine at an ion injection portion to form Ga fluoride with very low volatility. This provides high etching resistance in a region into which the Ga ions are injected and hence high etching selection ratio can be achieved. By injecting ions into a substrate, instead of forming an etching mask with a fixed thickness on the substrate, a function of the etching mask can be given to the substrate surface, and hence oblique etching with an influence of the shadowing effect restrained can be implemented. The present invention describes a case where Ga is used, but use of another material such as In will provide the same effect.

To describe it further, for example, there is reactive ion etching, hereinafter referred to as "Deep-RIE", as a deep drilling technology which enables high-aspect processing of silicon. For example, this includes an etching process using $SF_6$ gas and a process of alternately performing a side wall protective film formation process using $C_4F_8$ gas by the second (the so-called Bosch process).

By applying an etching mask including the Ga-containing portion to the process, a high etching selection ratio is obtained. The etching selection ratio of the etching mask 102 to the silicon substrate 100 is, for example, 800 or more, depending upon conditions. The distribution of Ga ions in a depth direction and the Ga ion concentration are controlled by the acceleration voltage of the Ga focused ion beam (FIB) and current and injection period of the Ga FIB, respectively. The conditions of the Ga focused ion beam (FIB) at this time are, for example, an acceleration voltage of 30 kV and a current of 5 nA. The ion dose amount is, for example, $3\times10^{16}$ ions/cm$^2$. In the distribution of Ga ions in a substrate depth direction at this time, a peak position thereof is at a depth of several tens of nm from a substrate surface. The method for forming an etching mask injects Ga ions into a substrate while slightly shaving the surface of the substrate by irradiating the outmost surface of the substrate with Ga ions using the Ga FIB. Accordingly, this is different from ordinary ion injection and forms a region having peak Ga concentration in the vicinity of the outermost surface of the substrate. The term "vicinity of the outermost surface of the substrate" used herein refers to a region in which a maximum Ga concentration in a depth direction from the substrate surface is distributed so as to be positioned at the outermost surface layer (within 50 nm from the surface) of the substrate. In the present invention, preferably, the outermost surface layer is within the range of 0 to 50 nm, more preferably, 0 to 20 nm and substantially 0 to 10 nm.

As described above, the etching mask 102 including the Ga-containing portion may have a very small thickness because an etching selection ratio is high. Accordingly, in forming an oblique hole in a substrate and a trench pattern by oblique etching, use of an etching mask including the Ga-containing portion enables suppression of an influence of the shadowing effect, thus attaining highly precise processing.

Second Embodiment

In the second embodiment, using the etching mask formed by the formation method according to the first embodiment, a method for fabricating a woodpile type three-dimensional structure in three-dimensional photonic crystal will be described below. FIGS. 2A to 2D are views illustrating a method for fabricating a three-dimensional structure according to the present embodiment. FIGS. 2A to 2D are views illustrating a fabricating process for three-dimensional structure. FIGS. 3E to 3J are views illustrating a method for fabricating a three-dimensional structure according to the present embodiment. FIGS. 3E to 3J are views illustrating a fabricating process for three-dimensional structure, subsequent to FIG. 2D.

Figure 2A:
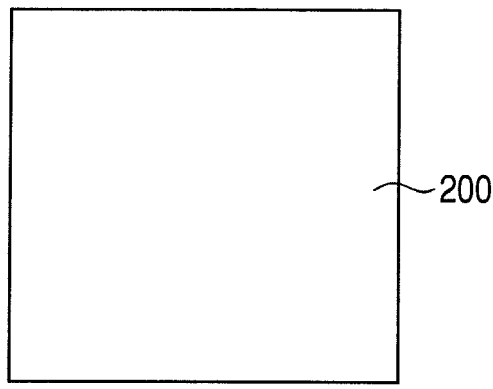
FIGS. 2A, 2B, 2C and 2D are views illustrating a method for fabricating a three-dimensional structure according to a second embodiment of the present invention and illustrating a fabricating process for three-dimensional structure.
Figure 2C:
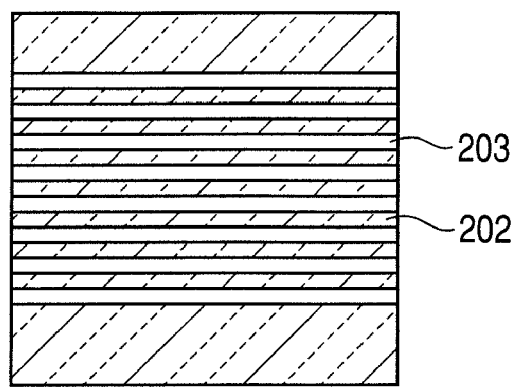
Figure 2B:
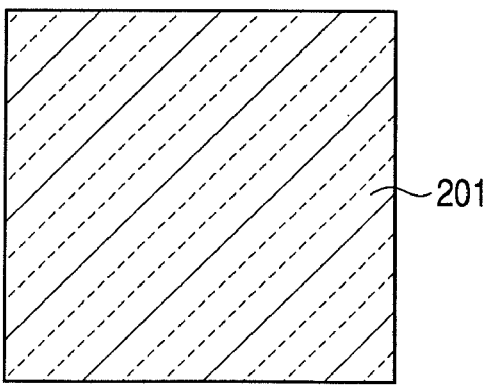

In a process of preparing a substrate, first, a substrate 200 including silicon is prepared as illustrated in FIG. 2A. As the substrate 200, in addition to silicon, Si compound including Si oxide and nitride may be used. As illustrated in FIG. 2B, for example, aluminum thin film 201 is formed on the substrate 200 to a thickness of, for example, 200 nm by the electron beam vapor deposition method.

Figure 2D:
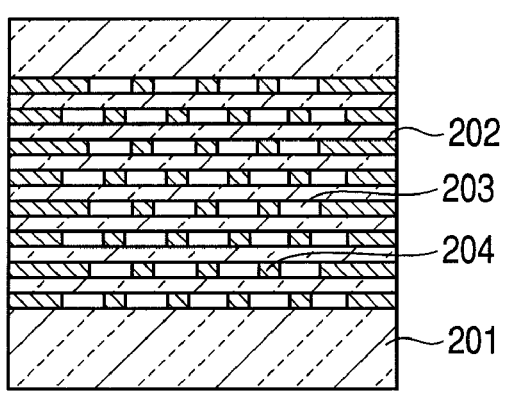

Next, using the method for forming an etching mask described in the first embodiment, a mask formation process for forming an etching mask on the substrate surface will be described below. First, after a resist pattern is formed on an aluminum thin film 201 using photolithography, the aluminum thin film 201 is subjected to patterning by the dry etching method to remove the resist pattern. Accordingly, as illustrated in FIG. 2C, an aluminum thin-film pattern 202 is formed on the silicon substrate 200. As illustrated in FIG. 2D, while a silicon exposed portion 203 between the aluminum thin-film patterns 202 is scanned, for example, with a Ga focused ion beam (FIB) in an in-plane direction thereof, an etching mask 204 including a Ga-containing portion is formed. At that time, a positioning mark (not illustrated) as well is formed. The formation conditions of the etching mask 204 are, for example, 30 kV of acceleration voltage and 5 nA of current, using the Ga focused ion beam (FIB). The ion dose amount is, for example, $3 \times 10^{16}$ ions/cm$^2$. At this time, a Ga ion depth distribution peak in the substrate is approximately of the order of tens of nm from a surface of a silicon exposed portion 203.

Figure 3E:
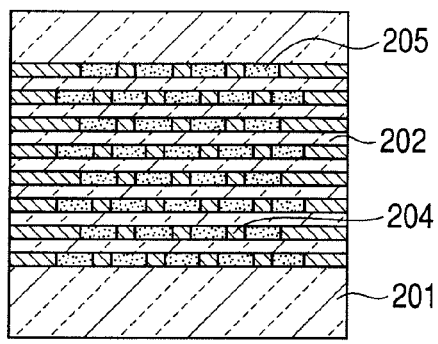
FIGS. 3E, 3F, 3G, 3H, 3I and 3J are views illustrating the method for fabricating a three-dimensional structure according to the second embodiment of the present invention and illustrating a fabricating process for three-dimensional structure, subsequent to FIG. 2D.

Next, using an etching mask 204 including the Ga-containing portion, an etching process of forming a plurality of holes in the substrate by dry etching the substrate from an oblique direction will be described below. As illustrated in FIG. 3E, with the aluminum thin-film pattern 202 and the Ga ion-containing portion 204 as etching mask, oblique holes 205 of 30 μm in depth is formed in the silicon substrate 200 using Deep-RIE from a direction of 45 degrees obliquely upward left relative to the silicon substrate 200. To the Deep-RIE, for example, Bosch process using $SF_6$ gas and $C_4F_8$ gas is applied. This allows an etching selection ratio of the silicon substrate 200 to the etching mask 204 to be increased. For the etching mask, approximately tens of nm is sufficient. Since the etching mask 204 is as thin as approximately several tens of nm, there is little effect from the shadowing effect in forming an oblique hole. The aluminum thin-film pattern 202 is disposed in such a direction as to have no influence upon an oblique etching direction, by which no shadowing effect occurs.

Next, a resist pattern (not illustrated) is formed on the silicon substrate 200 using photolithography. Then, for example, by wet etching with mixed solution of phosphoric acid, nitric acid and acetic acid, the aluminum thin-film pattern 202 is removed and, as illustrated in FIG. 3F, a silicon exposed portion 206 is formed.

Figure 3H:
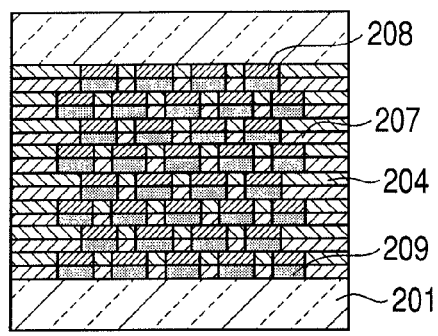
Figure 3F:
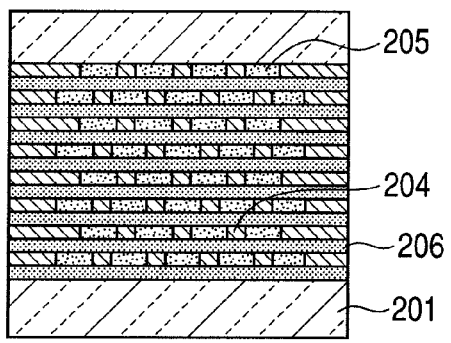
Figure 3I:
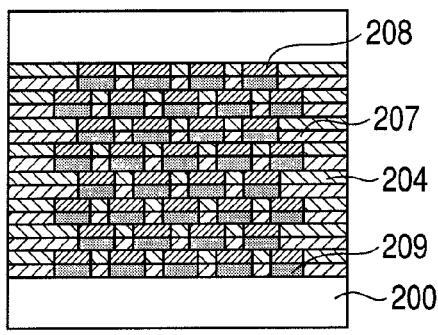
Figure 3G:
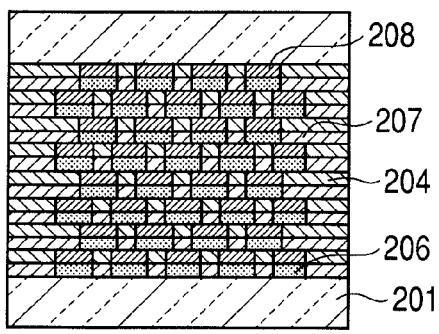

Next, while positioning is being performed using a positioning mark (not illustrated) formed in FIG. 2D, as illustrated in FIG. 3G, an etching mask with a Ga ion-containing portion 207 is formed on the silicon exposed portion 206 under the same conditions as in FIG. 2D. As illustrated in FIG. 3G, by forming the silicon exposed portion 206 of the hole in the etching mask at a position adjacent to the shorter direction of the hole forming pattern, a three-dimensional photonic crystal described later can be formed. As illustrated in FIG. 3G, for a silicon exposed portion when the oblique hole 205 is viewed from vertical top with respect to the substrate 200, of an inner wall of the oblique hole 205, an etching mask with a Ga ion-containing portion 208 is formed in the same way. By forming an etching mask including the Ga ion-containing portion 208, a three-dimensional photonic crystalline structure described later can be obtained because the inner wall portion of the oblique hole 205 is not etched during formation of an oblique hole in the next process.

Next, as illustrated in FIG. 3H, an oblique hole 209 having a depth of 30 μm is formed in the silicon substrate 200. Using etching masks 204, 207, 208 including the Ga ion-containing portion, the hole is formed according to Deep-RIE from 45-degree direction obliquely upward right relative to the silicon substrate 200. At this time, since the etching mask 207 is as very thin as approximately several tens of nm, there is very little shadowing effect in forming an oblique hole. The etching mask 208 protects the shape of the oblique hole 205 formed beforehand in the Deep-RIE.

Next, as illustrated in FIG. 3I, the aluminum thin-film pattern 202 portion remaining on the silicon substrate 200 is removed by wet etching, for example, with a mixed solution of phosphoric acid, nitric acid and acetic acid. Thus, a three-dimensional structure having oblique holes 205, 209 can be formed on the silicon substrate 200. If necessary, Ga included in Ga ion-containing portions 204, 207, 208 on the silicon substrate 200 is removed by etching with hydrochloric acid solution after heating to approximately 600° C., for example, with an oven. Thus, a three-dimensional structure as illustrated in FIG. 3J can be obtained.

Figure 3J:
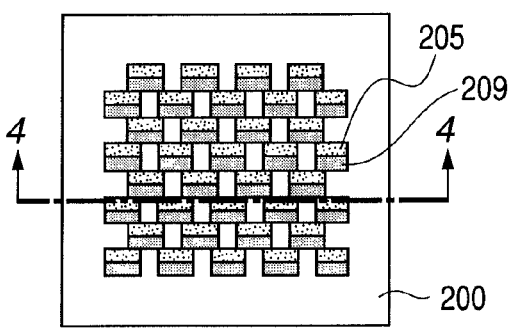
Figure 4:
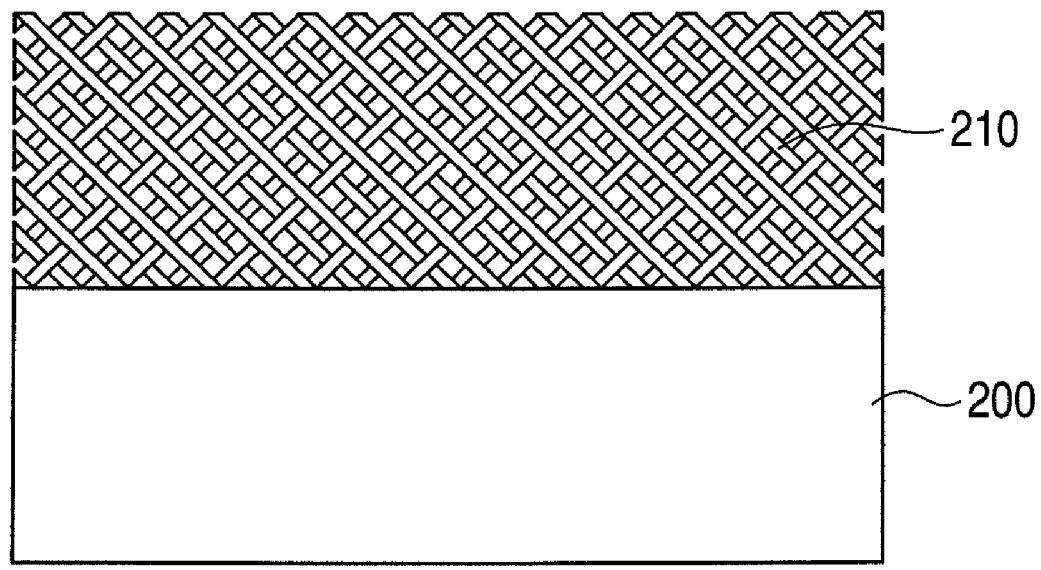
FIG. 4 is a view illustrating a method for fabricating a three-dimensional structure according to a second embodiment of the present invention and is a schematic view taken on line 4-4 of FIG. 3J.

FIG. 4 is a schematic diagram taken on line 4-4 of FIG. 3J. On the substrate 200, there is formed a three-dimensional structure 210 of a woodpile structure having oblique holes 205 and silicon rods including the etching mask 208, on the substrate 200. At this time, a rod cycle is set at, for example, 1 μm.

As described above, the method for fabricating a three-dimensional structure according to the present embodiment allows a mask used for oblique etching to be formed to be very thin in the vicinity of the substrate surface by a Ga focused ion beam, thus attaining little influence of a shadowing effect. Thus, a three-dimensional structure such as photonic crystal can be fabricated with high precision. In addition, a method for forming three-dimensional structure according to the present embodiment allows formation of a three-dimensional structure with a continuum having no interface between rods constituting three-dimensional photonic crystal. Accordingly, the three-dimensional photonic crystal provides better optical characteristics than a conventional fabricating method by layering.

Third Embodiment

In the third embodiment, a method for fabricating a three-dimensional structure in a different mode from the second embodiment will be described below. FIG. 5 is a view illustrating a method for fabricating a three-dimensional structure according to the present embodiment. FIGS. 5A to 5G are views illustrating a fabricating process for three-dimensional structure.

Figure 5A:
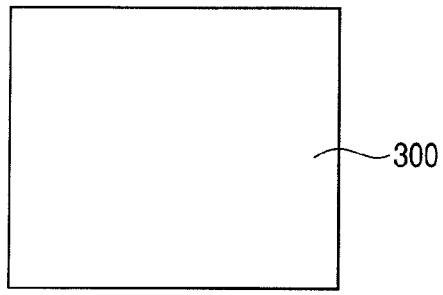
FIGS. 5A, 5B, 5C, 5D, 5E, 5F and 5G are views illustrating a method for fabricating a three-dimensional structure according to a third embodiment of the present invention.
Figure 5B:
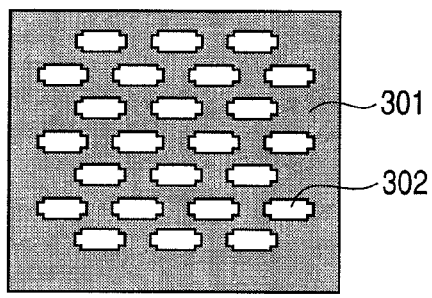

In a process of preparing a substrate, first, as illustrated in FIG. 5A, for example, a substrate 300 including silicon is prepared for. Next, a first mask formation process for forming a first etching mask on the substrate surface using a method for forming an etching mask described in the first embodiment will be described below. As illustrated in FIG. 5B, by irradiating a silicon substrate 300, for example, with a Ga focused ion beam (FIB) while scanning in an in-plane direction of the substrate, an etching mask 301 including a Ga-containing portion is formed on a silicon substrate 300. At that time, a positioning pattern (not illustrated) is also formed. Irradiation is performed under formation conditions of the etching mask 301 including the Ga-containing portion, for example, an acceleration voltage of 30 kV and a current of 5 nA. The ion dose amount is, for example, $3 \times 10^{16}$ ions/cm$^2$. At this time, the depth distribution peak of Ga ion in the substrate is approximately several tens of nm distant from the surface of the silicon substrate 300.

Figure 5C:
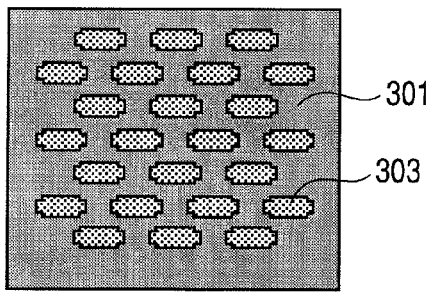

Next, a first etching process of dry-etching the substrate from a diagonal direction using the first etching mask to form a first plurality of holes on the substrate will be described below. As illustrated in FIG. 5C, with the Ga ion-containing portion 301 as an etching mask, an oblique hole 303 of 20 μm in depth is formed at the silicon 300 from 45-degree direction obliquely upward left relative to the silicon substrate 300, using Deep-RIE. At that time, a positioning pattern (not illustrated) is also formed. To the Deep-RIE, for example, a Bosch process using $SF_6$ gas and $C_4F_8$ gas is applied. Thus, an etching selection ratio of the silicon substrate 200 to the etching mask 204 can be increased and the etching mask having approximately several tens of nm is satisfactory. At this time, since the etching mask 301 is as very thin as approximately several tens of nm, there is little shadowing effect in forming oblique holes.

Figure 5D:
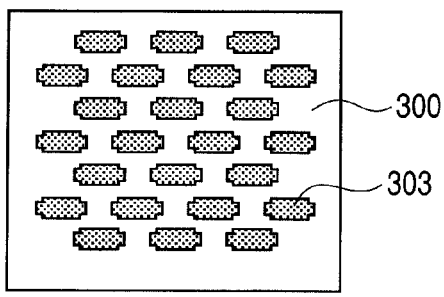
Figure 5E:
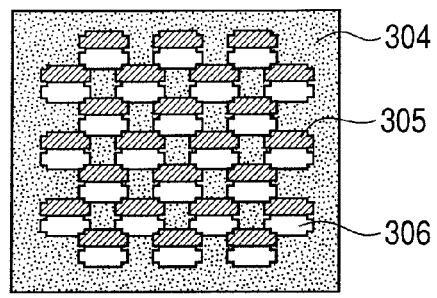

Next, as illustrated in FIG. 5D, Ga included in the Ga-containing portion 301 on the silicon substrate 300 is removed by etching with hydrochloric acid solution after heat treatment, for example, at a temperature of approximately 600° C. Next, using the method for forming an etching mask described above, a second mask formation process for forming a second etching mask on the substrate will be described below. While positioning is being performed using a positioning mark (not illustrated) in FIG. 5C, as illustrated in FIG. 5E, an etching mask including the Ga-containing portion 304 is formed on the silicon substrate 300 in the same way as in FIG. 5B. As illustrated in FIG. 5E, a hole forming pattern of the etching mask 304 is disposed at a position overlapped by a predetermined width in the shorter direction of the hole forming pattern 303. By using this layout, a rectangular plate structure described later is formed at each intersection of a columnar structure in a woodpile structure. The overlapped width corresponds to a thickness of the rectangular plate structure. An etching mask with a Ga ion-containing portion 305 is formed at a portion where silicon is exposed other than the overlapped portion when an inner wall of the oblique hole 303 is viewed from the perpendicular direction of the substrate 300. By forming an etching mask including a Ga ion-containing portion 305 in this way, the inner wall portion of the oblique hole 303 is not etched in forming an oblique hole in the next process, thus attaining a desired three-dimensional photonic crystalline structure described later.

Figure 5F:
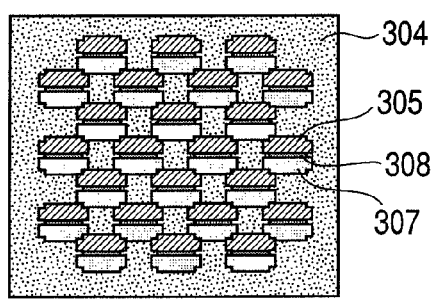

Next, a second etching process of dry-etching the substrate from an intersection direction relative to the direction of the first plurality of holes using the second etching mask to form a second plurality of holes will be described. As illustrated in FIG. 5F, with the Ga ion-containing portion 304 and 305 as an etching mask, an oblique hole 307 of, for example, 10 μm in depth is formed on the silicon substrate 306 from 45-degree direction obliquely upward right relative to the substrate, using Deep-RIE. Preferably, an oblique hole 307 is formed in a direction orthogonal to the previously formed oblique hole 303. At this time, since the etching mask 304 is as very thin as approximately tens of nm, there is little shadowing effect in forming an oblique hole. A Ga ion-containing portion 308 serves as a mask and thus the shape of an oblique hole previously formed using the etching mask 305 can be protected. An oblique etching portion 308 is a portion processed using Deep-RIE, from a direction of 45 degrees obliquely upward left and 45 degrees obliquely upward right relative to the substrate.

Figure 5G:
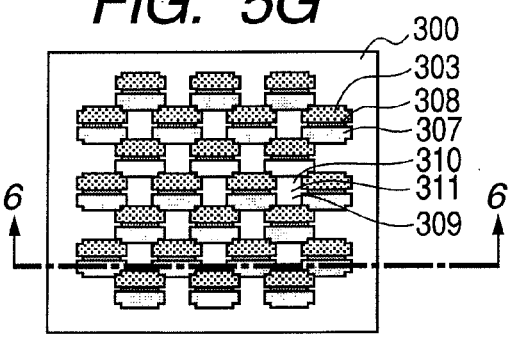
Figure 6:
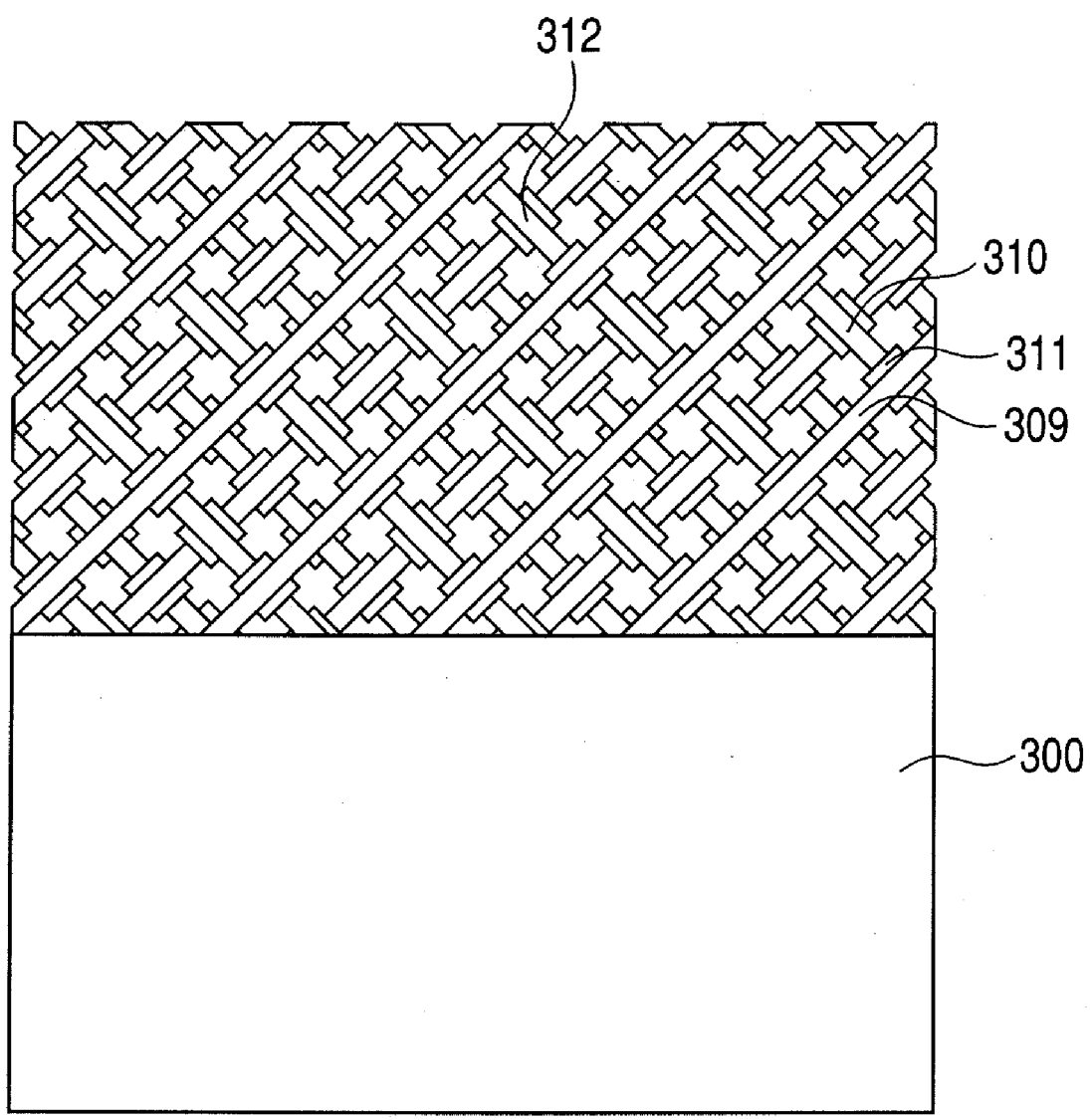
FIG. 6 is a view illustrating a method for fabricating a three-dimensional structure according to the third embodiment of the present invention and is a schematic view taken on line 6-6 of FIG. 5G.

Next, Ga included in Ga ion-containing portions 304, 305 on the silicon substrate 300 is removed, for example, by etching with hydrochloric acid solution after heat treatment at approximately 600° C. FIG. 5G is a top view illustrating a silicon three-dimensional structure formed in this way. FIG. 6 is a schematic view taken along line 6-6 of FIG. 5G On the substrate 300, there is formed three-dimensional photonic crystal including a silicon pad 311 positioned at intersections of silicon rods 309, 310 and the rod formed from oblique-hole processing. The cycles of rods 309, 310 are, for example, are defined at 1 μm, respectively.

As described above, in the method for fabricating a three-dimensional structure according to the present embodiment, since an etching mask formed by Ga FIB irradiation is as thin as approximately several tens of nm, there is little effect from a shadowing effect with oblique etching. Thus, a complicated three-dimensional structure can be formed with high precision. The method for forming three-dimensional structure according to the present embodiment provides a three-dimensional structure of a continuous body with no interface between a pad and a rod forming three-dimensional photonic crystal. Accordingly, the three-dimensional photonic crystal provides better optical characteristics than a conventional fabricating method by layering.

Fourth Embodiment

Figure 8E:
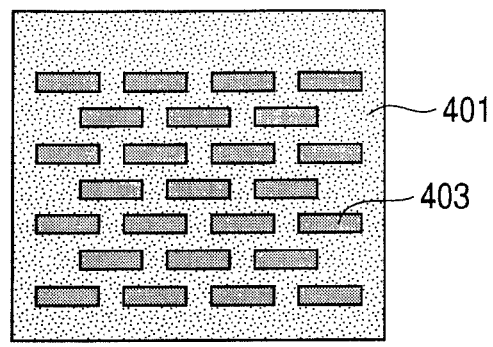
FIGS. 8E, 8F, 8G and 8H are views illustrating a method for fabricating three-dimensional photonic crystalline laser device according to the fourth embodiment of the present invention and illustrating a fabricating process subsequent to the fabricating process of FIGS. 7A, 7B, 7C and 7D.
Figure 8F:
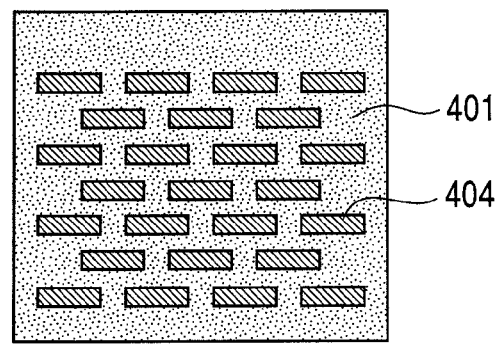
Figure 9I:
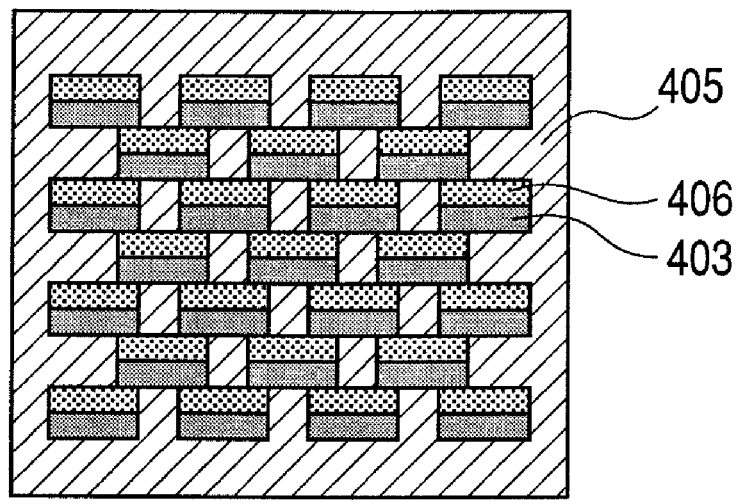
FIGS. 9I and 9J are views illustrating a method for fabricating three-dimensional photonic crystalline laser device according to the fourth embodiment of the present invention and illustrating a fabricating process subsequent to the fabricating process of FIGS. 8E, 8F, 8G and 8H.
Figure 9J:
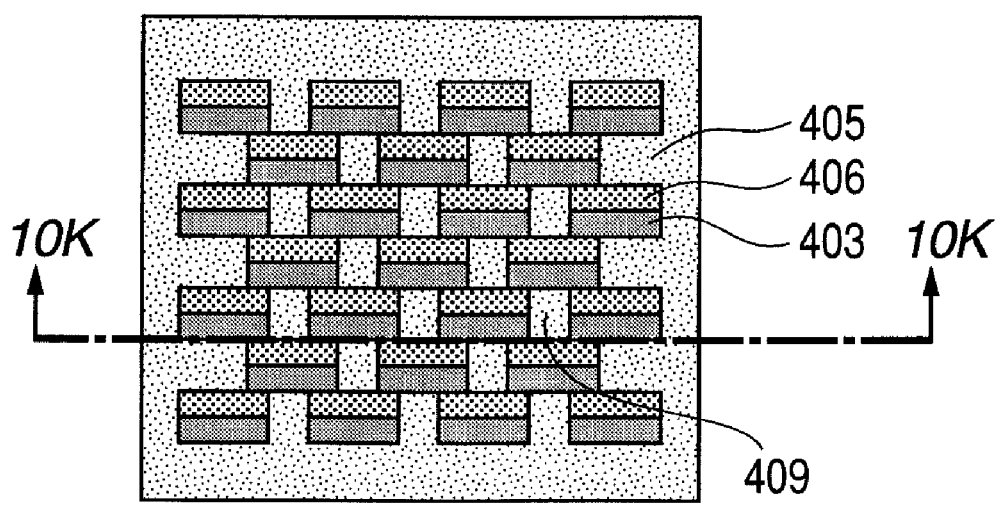
Figure 10K:
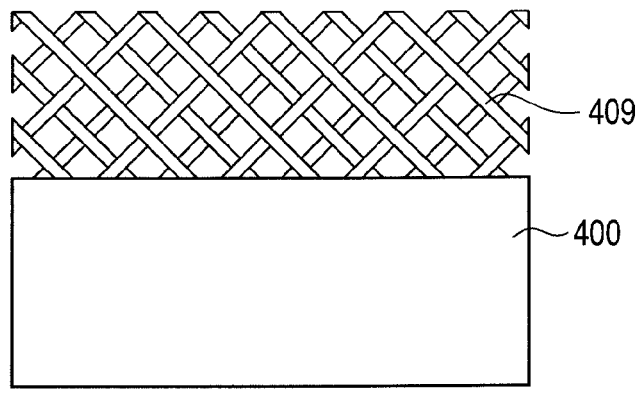
FIGS. 10K, 10L and 10M are views illustrating a method for fabricating three-dimensional photonic crystalline laser device according to the fourth embodiment of the present invention and illustrating a fabricating process subsequent to the fabricating process of FIGS. 9I and 9J.
Figure 10L:
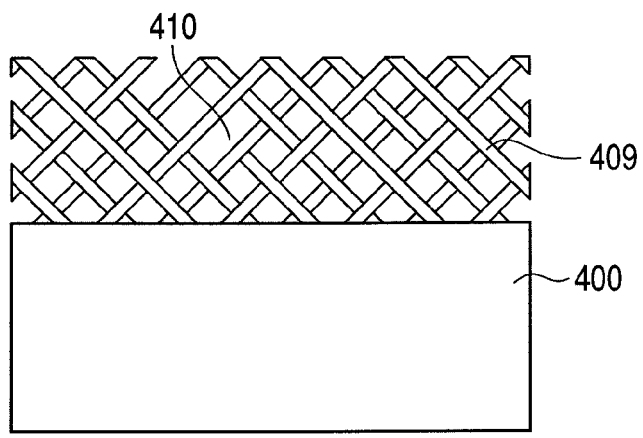
Figure 10M:
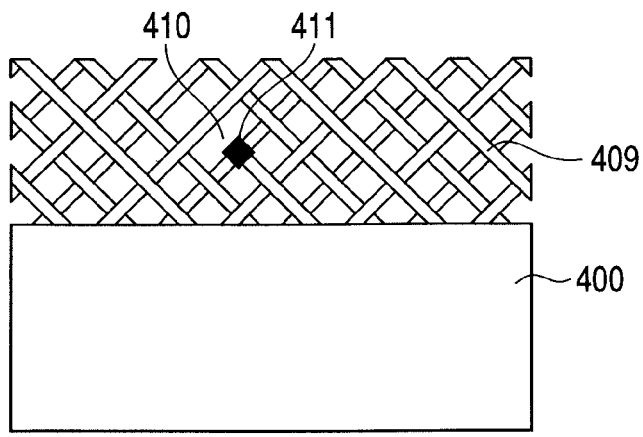

In a fourth embodiment, description will be made on a method for fabricating three-dimensional photonic crystalline laser device. FIGS. 7A to 10M are views illustrating a method for fabricating three-dimensional photonic crystalline laser device according to the present embodiment. FIGS. 7A to 7D are top views illustrating fabricating processes of a method for fabricating three-dimensional photonic crystalline laser device. FIGS. 8E to 8H are views illustrating fabricating processes subsequent to fabricating processes of FIGS. 7A to 7D. FIGS. 9I and 9J are views illustrating fabricating processes subsequent to fabricating processes of FIGS. 8E to 8H. FIGS. 10K to 10M are views illustrating fabricating processes subsequent to fabricating processes of FIGS. 9I and 9J. In FIGS. 7A to 10M, reference character 400 denotes a substrate, reference character 401 denotes a titanium oxide film ($TiO_2$ film), reference characters 402 and 405 denote mask layers, reference characters 403 and 406 denote hole forming patterns and reference character 404 denotes a sacrificial layer. In addition, reference character 409 denotes a three-dimensional photonic crystalline structure including titanium oxide, reference character 410 denotes a defect portion and reference character 411 denotes an active portion (active medium). The three-dimensional photonic crystalline laser device according to the present embodiment has, for example, a woodpile structure as a three-dimensional photonic crystalline structure.

Figure 7A:
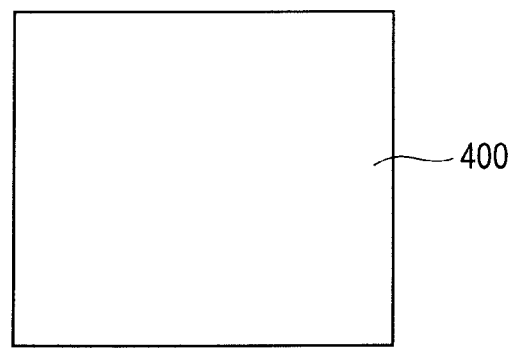
FIGS. 7A, 7B, 7C and 7D are views illustrating a method for fabricating three-dimensional photonic crystalline laser device according to a fourth embodiment of the present invention and illustrating a fabricating process for three-dimensional photonic crystalline laser device.
Figure 7B:
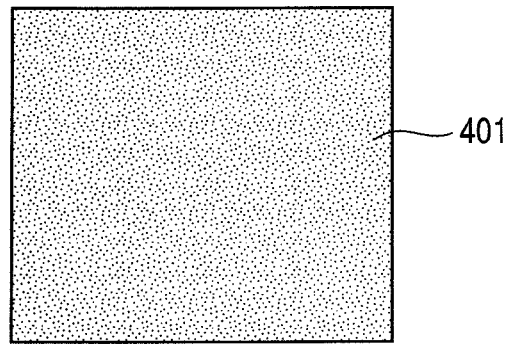
Figure 7C:
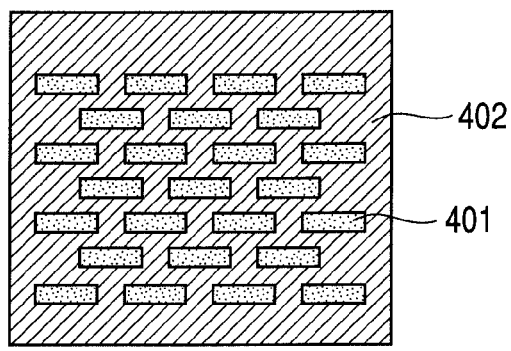

First, in a process illustrated in FIG. 7A, a substrate 400 is prepared for. As a material of the substrate 400, for example, synthetic quartz is used, and the size thereof is, for example, 4 inch (100 mm) in diameter and 525 μm in thickness. Next, in process illustrated in FIG. 7B, titanium oxide film ($TiO_2$ film) 401 is formed to a thickness of approximately 1,000 nm as a photonic crystalline material in a visible light range, for example, using the spatter method. Thus, a dielectric film forming three-dimensional photonic crystal is formed on the substrate. Next, in a process illustrated in FIG. 7C, by irradiating the titanium oxide film (TiO$_2$ film) 401, for example, with a Ga focused ion beam (FIB) while scanning in an in-plane direction of the substrate, an etching mask 402 comprising a Ga-containing portion is formed on the titanium oxide film (TiO$_2$ film). At that time, a positioning pattern (not illustrated) is also formed. Irradiation is performed under formation conditions of the etching mask 402 including the Ga-containing portion, for example, an acceleration voltage of 30 kV and a current of 5 nA. The ion dose amount is, for example, $3 \times 10^{16}$ ions/cm$^2$. At this time, a Ga ion depth distribution peak in the substrate is approximately tens of nm from a surface of titanium oxide film (TiO$_2$ film) 401.

Figure 7D:
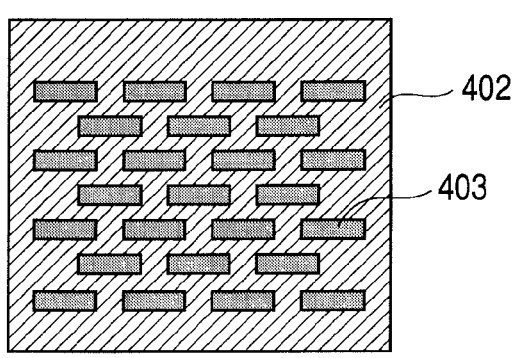

Next, in a process illustrated in FIG. 7D, with a mask layer 402 including Ga-containing portion of titanium oxide film (TiO$_2$ film) 401 as a mask, the titanium oxide film (TiO$_2$ film) 401 is subjected to patterning, for example, using reactive ion etching with inductive coupling plasma (ICP). When the longitudinal direction of the mask pattern 402 is taken as lateral direction and the horizontal plane of the substrate 400 is taken as zero degrees, a hole forming pattern 403 is formed in a direction of 45 degrees obliquely from upward left to downward right. Next, as illustrated in FIG. 8E, after heating is performed to approximately 600° C., for example, with an oven, etching is performed with hydrochloric acid solution to remove Ga from the Ga-containing portion 402 of the titanium oxide film (TiO$_2$ film) 401. Next, in a process illustrated in FIG. 8F, a sacrificial layer 404 is embedded in the hole forming pattern 403. Specifically, first, in the hole forming pattern 403 and on the titanium oxide film 401, for example, copper film is formed as a sacrificial layer 404, for example, by an atomic layer deposition method (ALD). Next, the copper film is polished and flattened until the titanium oxide film 401 is exposed, for example, by chemical-mechanical polishing (CMP), thereby removing the copper film on the surface of the titanium oxide film 401 and forming the sacrificial layer 404 only in the hole forming pattern 403. The copper film is selected as the sacrificial portion 404 herein, but for example, aluminum film or chromium film may be used. Moreover, a close-contact film may be introduced for high close contact between the sacrificial portion and the titanium oxide layer, as needed.

Figure 8G:
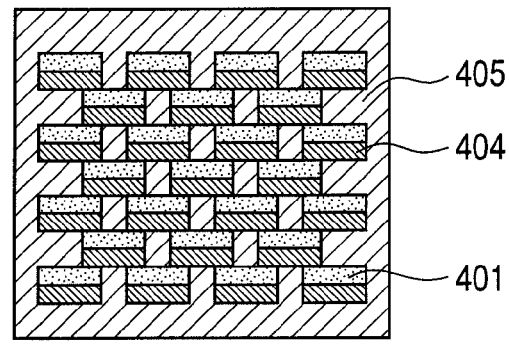
Figure 8H:
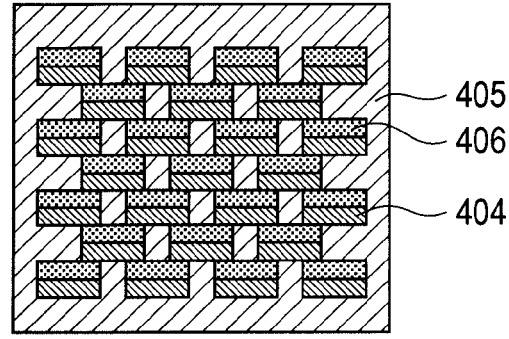

Next, in a process illustrated in FIG. 8G by irradiating the silicon substrate 400, for example, with the Ga focused ion beam (FIB) while scanning in an in-plane direction of the substrate, an etching mask 405 including a Ga-containing portion is formed on the substrate. At that time, a positioning pattern (not illustrated) is also formed. Irradiation is performed under formation conditions of the etching mask 405 including the Ga-containing portion, for example, an acceleration voltage of 30 kV and a current of 5 nA. The ion dose amount is, for example, $3 \times 10^{16}$ ions/cm$^2$. At this time, a Ga ion depth distribution peak in the substrate is approximately tens of nm from a surface of titanium oxide film 401. The rectangular hole forming pattern of the mask layer 405 has a positional relationship in forming one rectangular hole forming pattern, adjacent to the shorter direction of the hole forming pattern 403. Next, in a process illustrated in FIG. 8H, a hole forming pattern 406 is formed. At that time, with a mask layer 405 including Ga-containing portion on titanium oxide film 401 as a mask, the titanium oxide film (TiO$_2$ film) 401 is subjected to patterning, for example, using reactive ion etching with inductive coupling plasma (ICP). When the longitudinal direction of the mask layer 405 pattern is taken as a right/left direction and the horizontal surface of the substrate 400 is taken as 0 degrees, the hole forming pattern 406 is formed in a direction of 45 degrees obliquely from upward right to downward left. Next, as illustrated in FIG. 9I, the sacrificial portion 404 in the hole forming pattern 403 is removed by wet etching. Next, as illustrated in FIG. 9J, after the mask 405 including a Ga-containing portion on the titanium oxide film 401 is heated to approximately 600° C., for example, with an over, etching is performed with hydrochloric acid solution to remove the mask. As such, a three-dimensional photonic crystalline structure 409 is formed on the substrate 400. According to these processes, for example, by performing etching, at least twice, from a direction of 45 degrees obliquely relative to a perpendicular of the substrate surface, a three-dimensional photonic crystalline structure can be formed.

FIG. 10K is a sectional view taken along line of 10K-10K of a three-dimensional photonic crystalline structure 409 illustrated in FIG. 9J. On the titanium oxide layer 401 positioned on the substrate 400, there is formed a three-dimensional crystalline 409 having a woodpile structure including titanium oxide. A cycle of the three-dimensional photonic crystalline structure 409 is approximately 250 nm. Next, in a process of forming a structural defect portion in the three-dimensional photonic crystalline structure, for example, as illustrated in FIG. 10I, the defect portion 410 is formed. Specifically, by focused ion beam processing, for example, by partially removing a columnar structure of woodpile structure along the columnar structure, the defect portion 410 is formed in the three-dimensional photonic crystalline structure 409. Next, in a process of forming an active portion exhibiting a light-emitting action at the defect portion, as illustrated in FIG. 10M, by irradiating the inside of the defect portion 409 with light, an active portion 411 exhibiting a light-emitting action is formed. At that time, for example, by selectively forming quantized dots including GaN by means of the electron beam induced chemical vapor deposition (EB-CVD) method, passive type three-dimensional photonic crystalline laser device can be formed. In the present embodiment, as a patterning method of the titanium oxide film 401, reactive ion etching by inductive coupling plasma (ICP) was used, but reactive ion beam etching or high-speed atomic beam etching may be used.

Fifth Embodiment

Figure 12E:
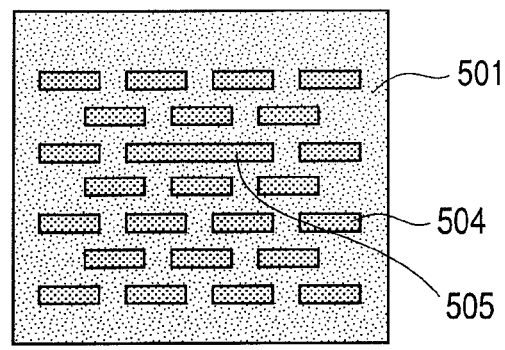
FIGS. 12E, 12F, 12G and 12H are views illustrating a method for fabricating three-dimensional photonic crystalline laser device according to the fifth embodiment of the present invention and illustrating a fabricating process subsequent to the fabricating process of FIGS. 11A, 11B, 11C and 11D.
Figure 12F:
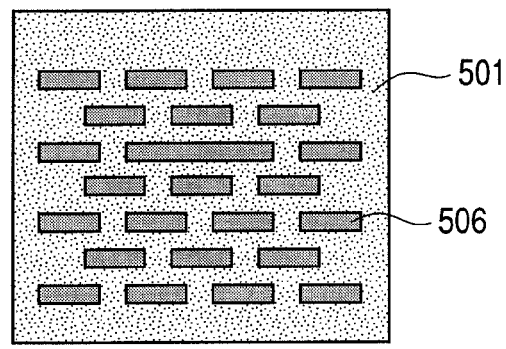
Figure 13I:
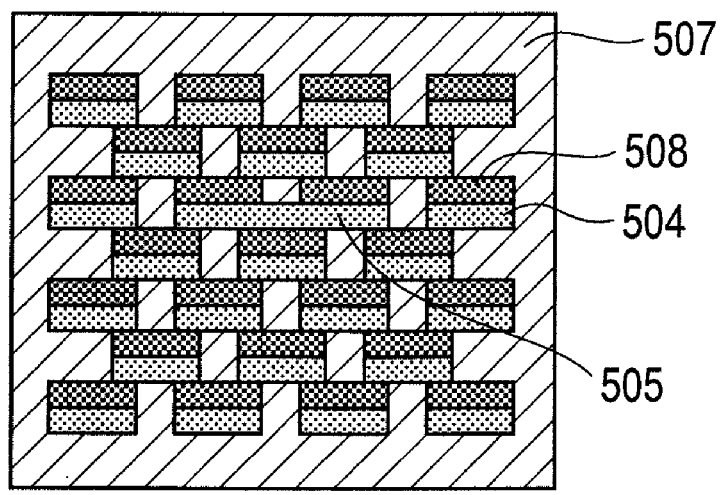
FIGS. 13I and 13J are views illustrating a method for fabricating three-dimensional photonic crystalline laser device according to the fifth embodiment of the present invention and illustrating a fabricating process subsequent to the fabricating process of FIGS. 12E, 12F, 12G and 12H.
Figure 13J:
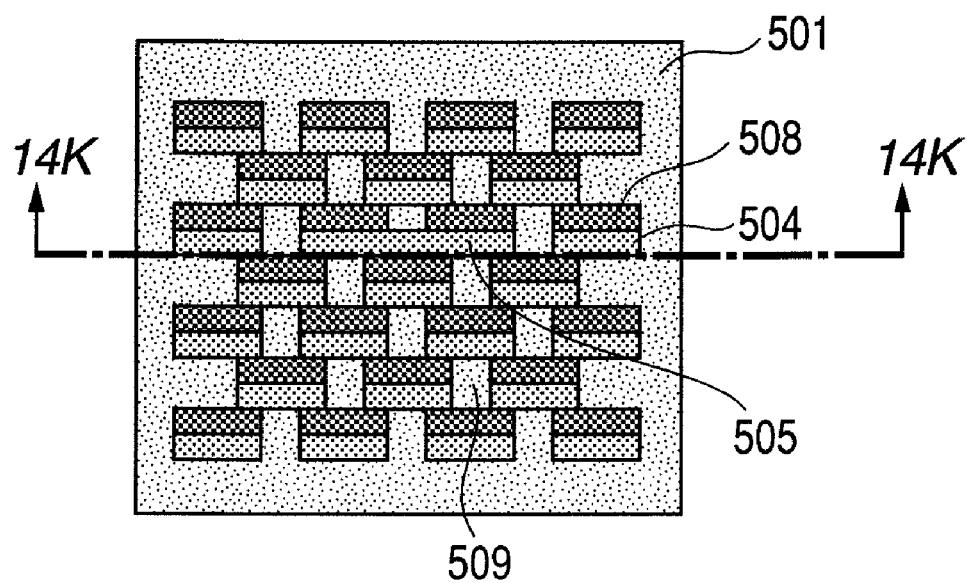
Figure 14K:
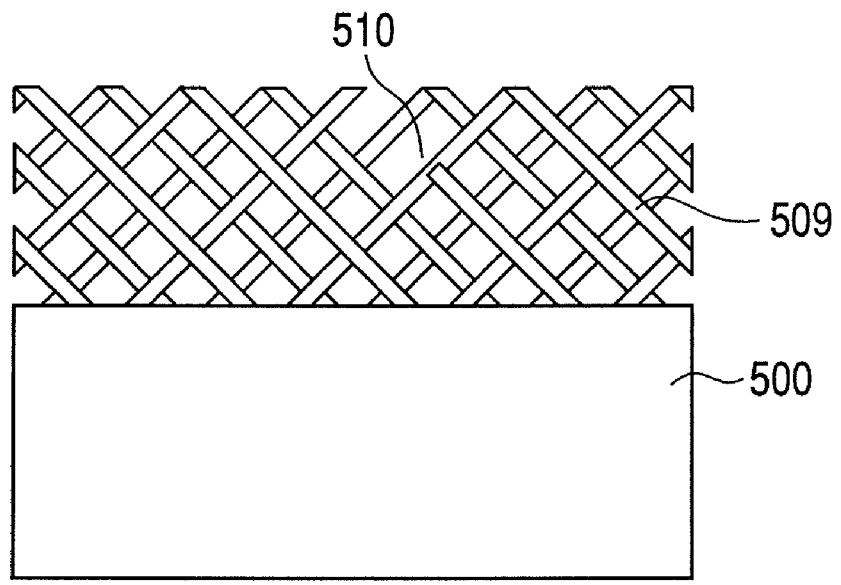
FIGS. 14K and 14L are views illustrating a method for fabricating three-dimensional photonic crystalline laser device according to the fifth embodiment of the present invention and illustrating a fabricating process subsequent to the fabricating process of FIGS. 13I and 13J.
Figure 14L:
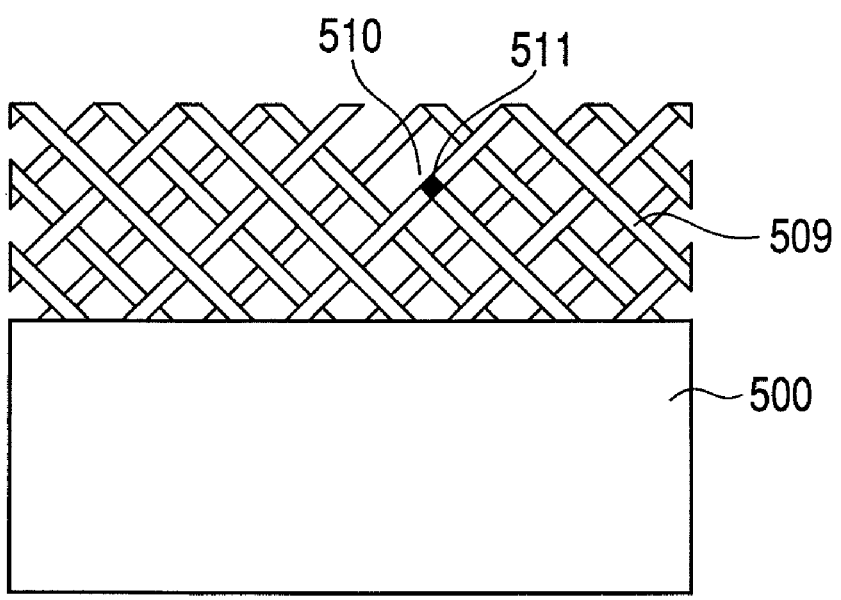

In a fifth embodiment, description will be made on a method for fabricating three-dimensional photonic crystalline laser device in a different mode from the fourth embodiment. FIGS. 11A to 14L are views illustrating a method for fabricating three-dimensional photonic crystalline laser device according to the present embodiment. FIGS. 11A to 11D are top views illustrating fabricating processes of a method for fabricating three-dimensional photonic crystalline laser device. FIGS. 12E to 12H are views illustrating fabricating processes subsequent to the fabricating processes of FIGS. 11A to 11D. FIGS. 13I and 13J are views illustrating fabricating processes subsequent to the fabricating processes of FIGS. 12E to 12H. FIGS. 14K and 14L are views illustrating fabricating processes subsequent to the fabricating processes of FIGS. 13I and 13J. FIGS. 11A to 14L show a substrate 500, titanium oxide films 501, 503, mask layers 502 and 507, hole forming patterns 504, 505, 508 and a sacrificial layer 506. Also shown are a three-dimensional photonic crystalline structure 509 includes titanium oxide, a defect portion 510 and an active medium 511. The three-dimensional photonic crystalline laser device according to the present embodiment has, for example, a woodpile structure as a three-dimensional photonic crystalline structure.

Figure 11A:
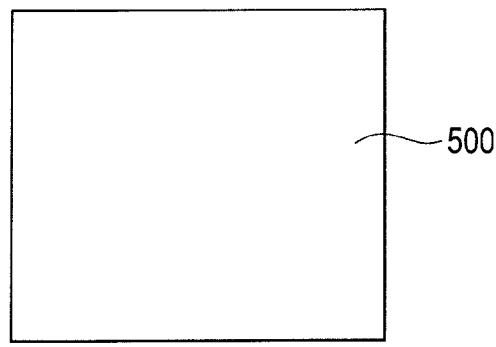
FIGS. 11A, 11B, 11C and 11D are views illustrating a method for fabricating three-dimensional photonic crystalline laser device according to a fifth embodiment of the present invention and are top views illustrating a fabricating process for three-dimensional photonic crystalline laser device.
Figure 11B:
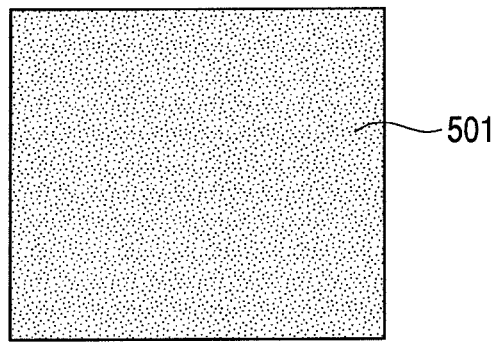
Figure 11C:
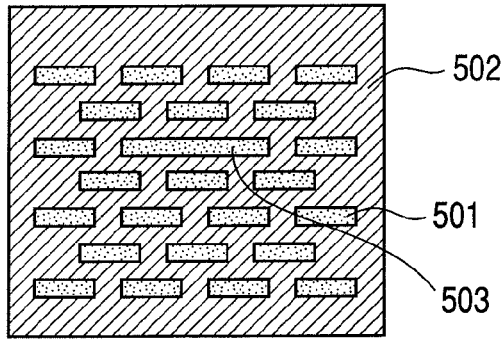

First, as illustrated in FIG. 11A, a substrate 500 is prepared for. As a material of the substrate 500, for example, synthetic quartz is used, and the size thereof is, for example, 4 inches (100 mm) in diameter and 525 μm in thickness as a dimension of the substrate 500. Next, as illustrated in FIG. 11B, for example, titanium oxide film 501 is formed to a thickness of approximately 1,000 nm as a material having high refractive index through which a visible light penetrates, for example, using the spatter method. Thus, a dielectric film forming three-dimensional photonic crystal is formed on the substrate. Next, as illustrated in FIG. 11C, an etching mask 502 is formed. For example, as a mask layer 502 in patterning a titanium oxide layer 501, by irradiating a titanium oxide film 501, for example, with a Ga focused ion beam (FIB) while scanning in an in-plane direction of the substrate, the etching mask 502 including a Ga-containing portion is formed. At that time, a positioning pattern (not illustrated) is also formed. Irradiation is performed under formation conditions of the etching mask 502 including the Ga-containing portion, for example, an acceleration voltage of 30 kV and a current of 5 nA. The ion dose amount is, for example, $3\times10^{16}$ ions/cm$^2$. At this time, a Ga ion depth distribution peak in the substrate is approximately tens of nm from a surface of titanium oxide film 501. At the same time the mask 502 for forming a three-dimensional photonic crystalline structure is formed, mask formation is performed so that the titanium oxide film 501 of a portion corresponding to a position for forming a defect portion in the structure is exposed. Specifically, a portion 503 at which the titanium oxide film is exposed corresponds to a position for forming the defect portion in the structure and includes a region obtained by adding the exposed portion 501 of two titanium oxide films adjacent to each other in the longitudinal direction (lateral direction) to a boundary portion therebetween. By hole forming pattern formation for the next process, a hole forming pattern is formed at 501 and a hole forming pattern is formed at the portion 503 as well, thus creating a defect portion in 503 at the same time as a three-dimensional photonic crystalline structure is formed.

Figure 11D:
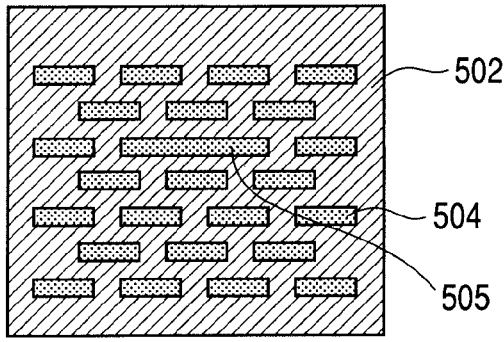

Next, as illustrated in FIG. 11D, the hole forming pattern 504 is formed. At that time, with the mask layer 502 including Ga-containing portion as a mask, the titanium oxide film 501 is subjected to patterning using reactive ion etching by inductive coupling plasma (ICP). When the longitudinal direction of the mask layer 502 pattern is taken as a right/left direction and the horizontal surface of the substrate 500 is taken as 0 degrees, the titanium oxide hole forming pattern 504 is formed in a direction of 45 degrees obliquely from upward left to downward right. At the same time as a three-dimensional photonic crystalline structure is formed, a defect portion 510 is formed in the structure. Next, as illustrated in FIG. 12E, after the mask 502 including a Ga-containing portion on the titanium oxide film 501 is heated to approximately 600° C., for example, with an oven, etching is performed with hydrochloric acid solution to remove the mask. Next, as illustrated in FIG. 12F, a sacrificial layer 506 is embedded. This step is the same as for the fourth embodiment.

Figure 12G:
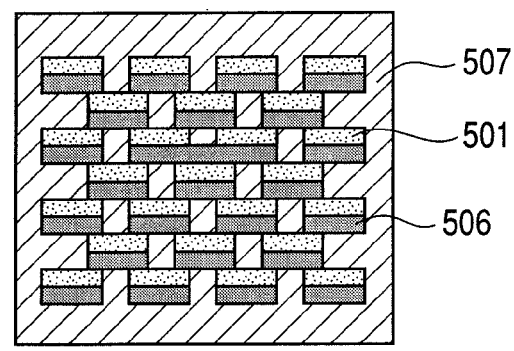
Figure 12H:
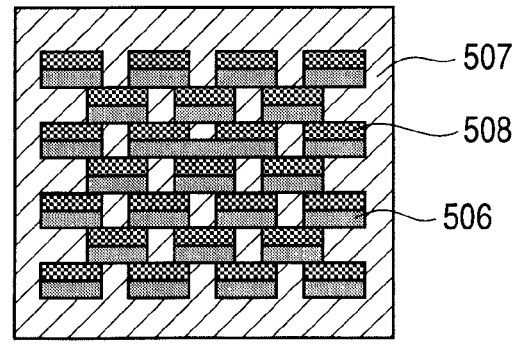

Next, as illustrated in FIG. 12G, by irradiating the titanium oxide film 501, for example, with a Ga focused ion beam (FIB) while scanning in an in-plane direction of the substrate, an etching mask 507 including a Ga-containing portion is formed on the titanium oxide film. Irradiation is performed under formation conditions of the etching mask 507 including the Ga-containing portion, for example, an acceleration voltage of 30 kV and a current of 5 nA. The ion dose amount is, for example, $3\times10^{16}$ ions/cm$^2$. At this time, a Ga ion depth distribution peak in the substrate is approximately tens of nm from a surface of titanium oxide film 501. The rectangular hole forming pattern of the mask layer 507 has a positional relationship in forming one rectangular hole forming pattern, adjacent to the shorter direction of the hole forming patterns 504, 505. Next, as illustrated in FIG. 12H, a hole forming pattern 508 is formed. For example, with a mask layer 507 including Ga-containing portion on titanium oxide film 501 as a mask, the titanium oxide film 501 is subjected to patterning, for example, using reactive ion etching with inductive coupling plasma (ICP). When the longitudinal direction of the mask layer 507 pattern is taken as a right/left direction and the horizontal surface of the substrate 500 is taken as 0 degrees, the hole forming pattern 508 is formed in a direction of 45 degrees obliquely from upward right to downward left. Next, as illustrated in FIG. 13I, the hole forming patterns 504, 505 and the sacrificial layer 506 in the hole forming pattern 508 are removed by wet etching. Next, as illustrated in FIG. 13J, after the mask 507 including a Ga-containing portion on the titanium oxide film 501 is heated to approximately 600° C., for example, with an oven, etching is performed with hydrochloric acid solution. Thus, a three-dimensional photonic crystalline structure 509 made of titanium oxide and a defect portion 510 in the structure are formed on the substrate 500.

FIG. 14K is a sectional view taken along of line 14K-14K of FIG. 13J. On the substrate 500, there is formed a three-dimensional photonic crystalline structure 509 having a woodpile structure including titanium oxide 501 and a defect portion 510 with a columnar structure of the woodpile structure partially removed. A cycle of the three-dimensional photonic crystalline structure 509 is approximately 250 nm. Next, as illustrated in FIG. 14I, an active portion 511 exhibiting a light-emitting action by light irradiation is formed in a defect portion 510 of the three-dimensional photonic crystalline structure 509. At that time, for example, by selectively forming quantized dots including GaN as an active portion, for example, by means of the electron beam induced chemical vapor deposition (EB-CVD) method, passive type three-dimensional laser device can be formed. In the present embodiment, as a patterning method of the titanium oxide film 501, reactive ion etching by inductive coupling plasma (ICP) was used, but reactive ion beam etching or high-speed atomic beam etching may be used.

Sixth Embodiment

Figure 18M:
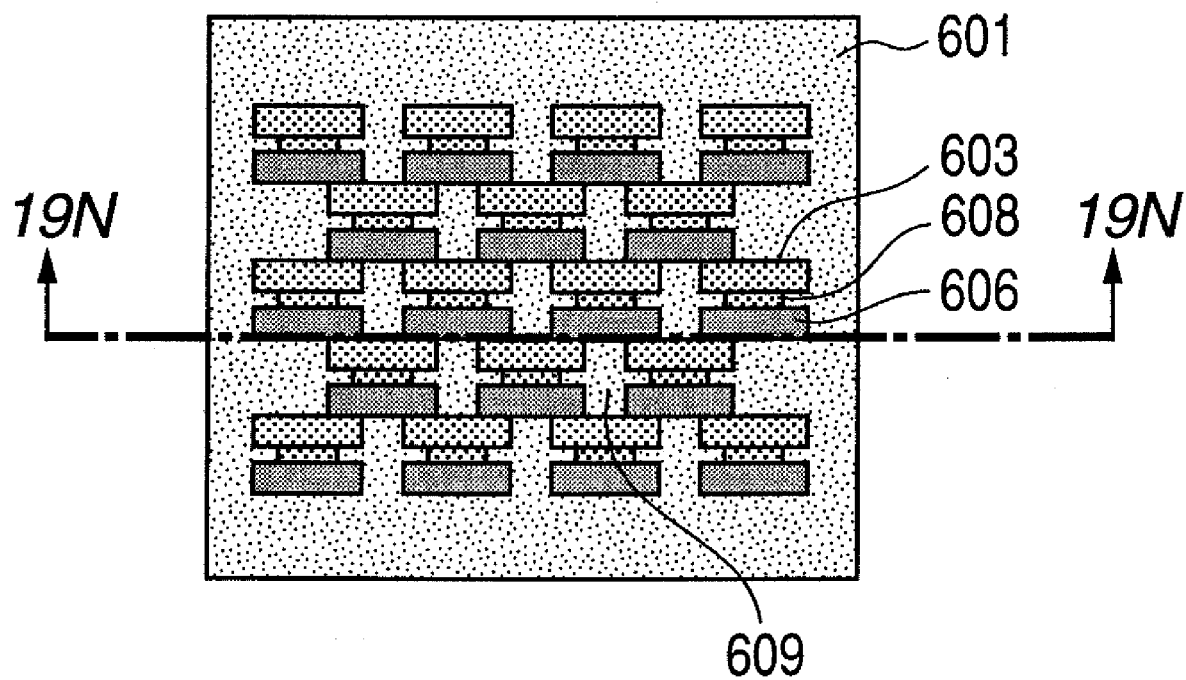
FIG. 18M is a view illustrating a method for fabricating three-dimensional photonic crystalline laser device according to the sixth embodiment of the present invention and illustrating a fabricating process subsequent to the fabricating process of FIGS. 17I, 17J, 17K and 17L.
Figure 19N:
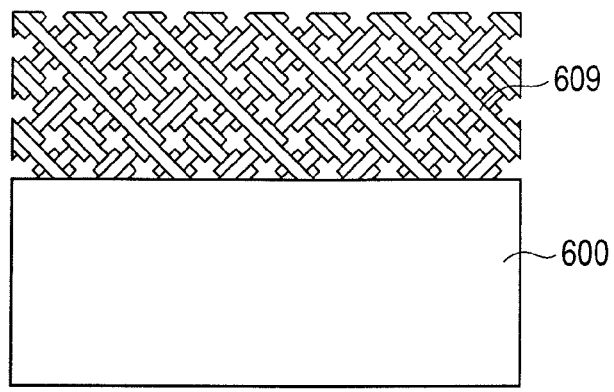
FIGS. 19N, 19O and 19P are views illustrating a method for fabricating three-dimensional photonic crystalline laser device according to the sixth embodiment of the present invention and illustrating a fabricating process subsequent to the fabricating process of FIG. 18M.
Figure 19O:
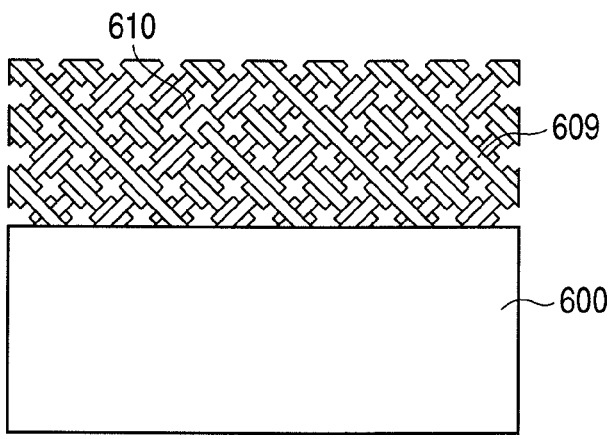
Figure 19P:
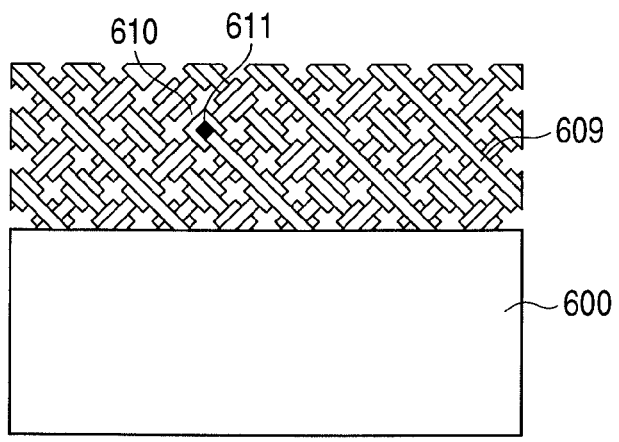
Figure 20A:
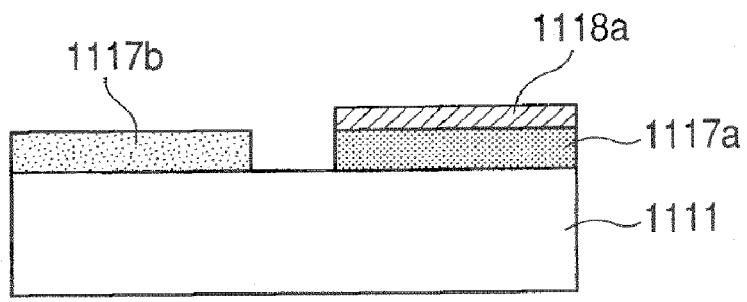
FIGS. 20A, 20B and 20C are views illustrating an oblique etching method in Japanese Patent Application Laid-Open No. H05-029283.
Figure 20B:
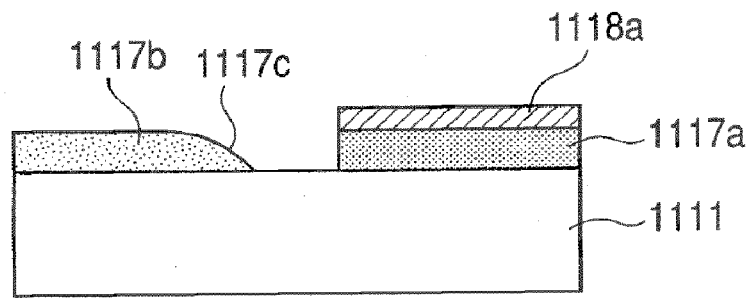
Figure 20C:
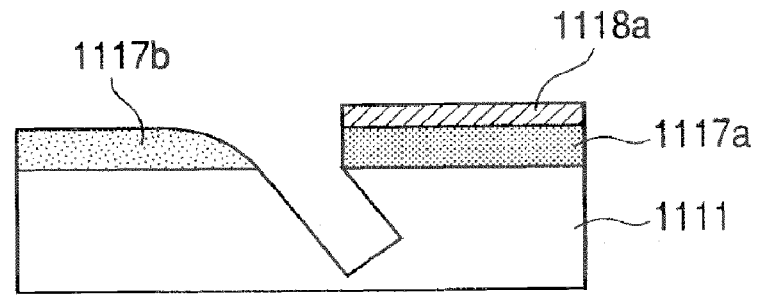
Figure 21A:
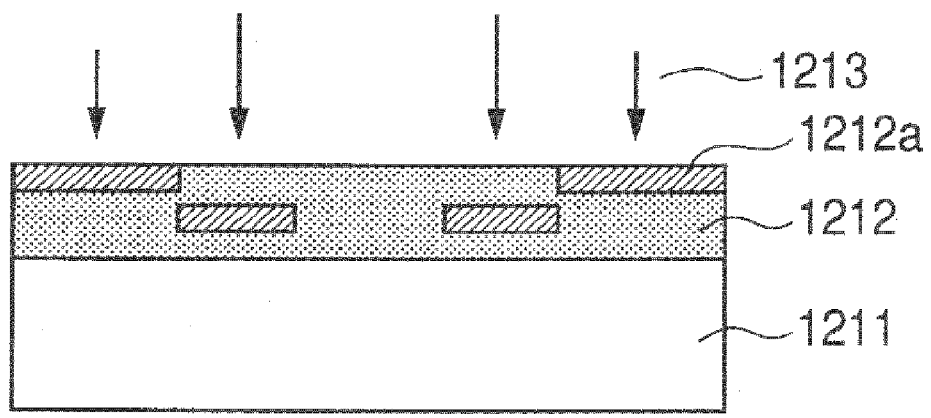
FIGS. 21A and 21B are views illustrating a step pattern formation process of thin-film processing in U.S. Pat. No. 5,236,547.
Figure 21B:
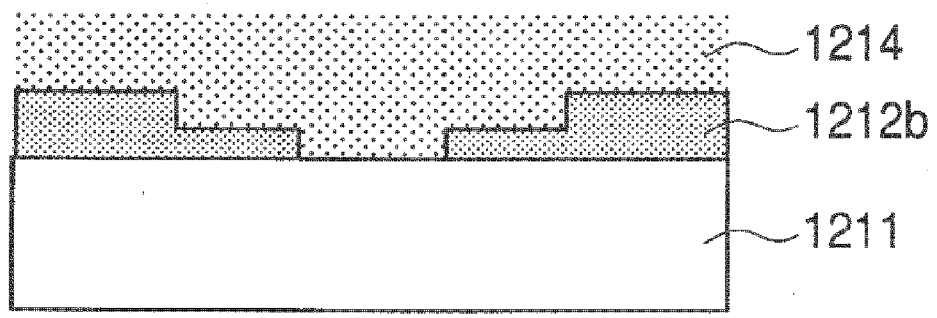
Figure 22:
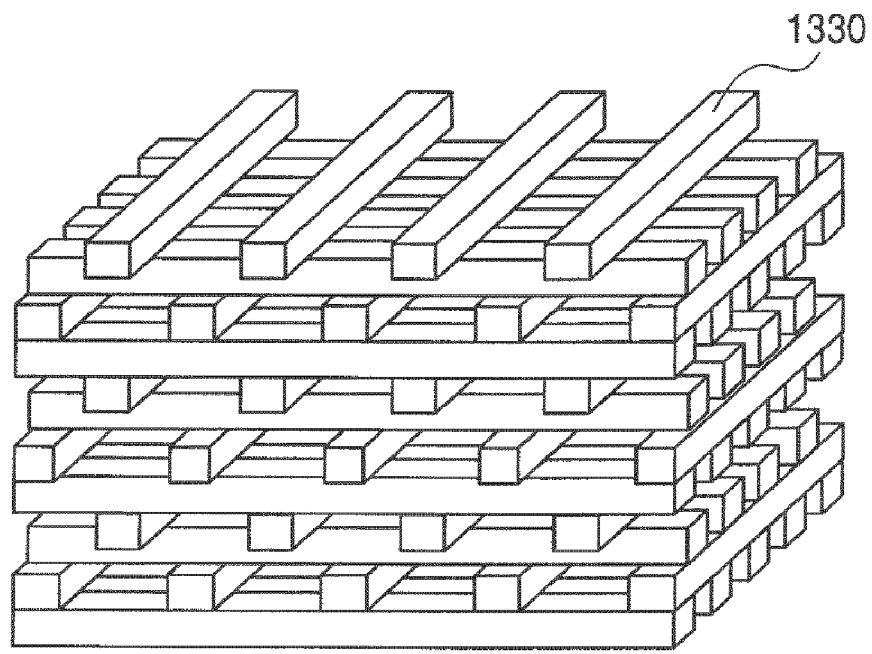
FIG. 22 is a schematic view illustrating three-dimensional photonic crystal having a woodpile structure in U.S. Pat. No. 5,335,240.
Figure 23A:
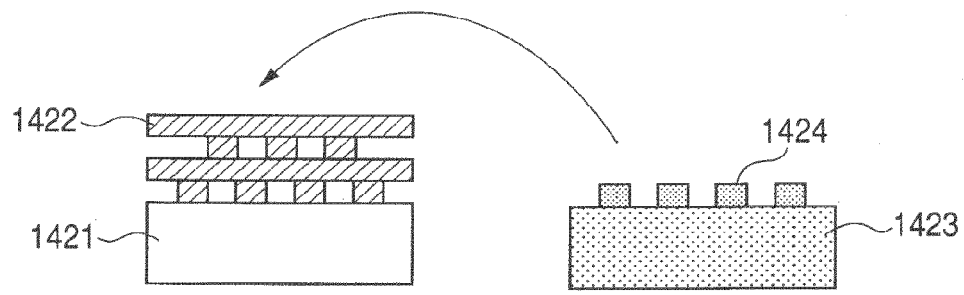
FIGS. 23A, 23B, 23C, 23D, 23E and 23F are schematic views illustrating three-dimensional photonic crystal having a woodpile structure in Japanese Patent Application Laid-Open No. 2004-219688.
Figure 23B:
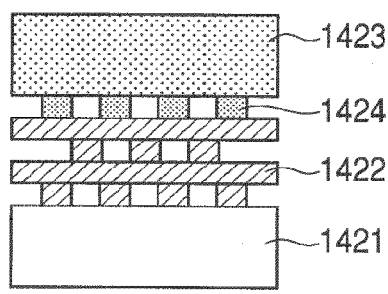
Figure 23C:
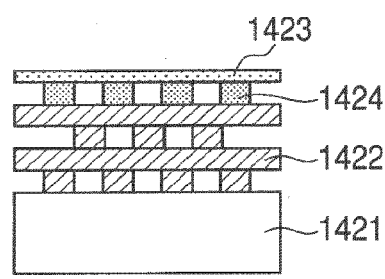
Figure 23D:
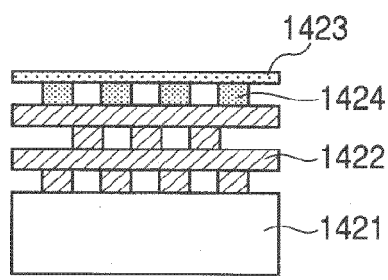
Figure 23E:
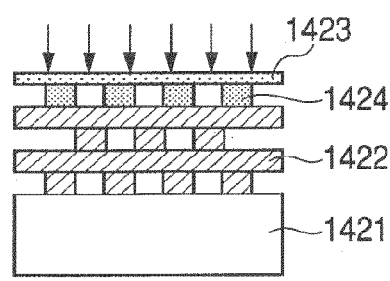
Figure 23F:
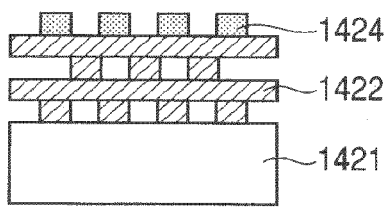

In the sixth embodiment, a method for fabricating three-dimensional photonic crystalline laser device in a different mode from the fourth and the fifth embodiments will be described below. FIGS. 15A to 19P are views illustrating a method for fabricating three-dimensional photonic crystalline laser device according to the present embodiment. FIGS. 15A to 15D are top views illustrating fabricating processes of a method for fabricating three-dimensional photonic crystalline laser device. FIGS. 16E to 16H are views illustrating fabricating processes subsequent to fabricating processes of FIGS. 15A and 15D. FIGS. 17I to 17L are views illustrating fabricating processes subsequent to fabricating processes of FIGS. 16E to 16H. FIG. 18M is a view illustrating fabricating processes subsequent to fabricating processes of FIGS. 17I to 17L. FIGS. 19N and 19P are views illustrating fabricating processes subsequent to fabricating processes of FIG. 18. In FIGS. 15A to 19P, reference character 600 denotes a substrate, reference character 601 denotes titanium oxide film, reference characters 602, 605, 607 denote mask layers, reference characters 603, 606, 608 denote hole forming patterns and reference character 604 denotes a sacrificial layer. Reference character 609 denotes a three-dimensional photonic crystalline structure including titanium oxide, reference character 610 denotes a defect portion and reference character 611 denotes an active medium. The three-dimensional photonic crystalline laser device according to the present embodiment has, for example, such a shape that a rectangular plate structure is sandwiched between intersections of a columnar structure of a woodpile structure as a three-dimensional photonic crystalline structure.

Figure 15A:
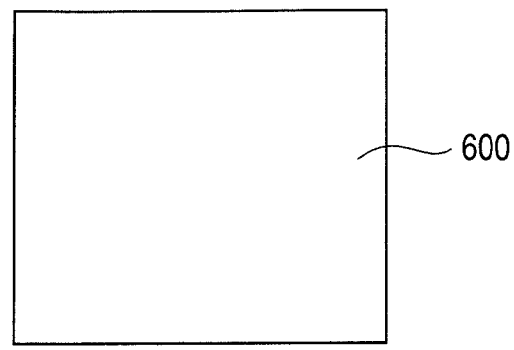
FIGS. 15A, 15B, 15C and 15D are views illustrating a method for fabricating three-dimensional photonic crystalline laser device according to a sixth embodiment of the present invention and are top views illustrating a fabricating process for three-dimensional photonic crystalline laser device.
Figure 15B:
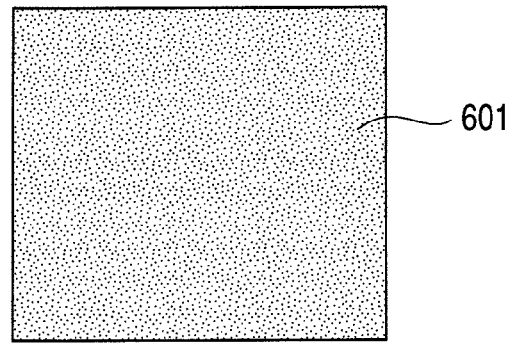
Figure 15C:
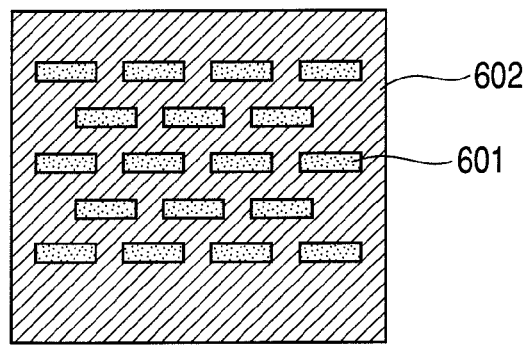

First, as illustrated in FIG. 15A, a substrate 600 is prepared for. As a material of a substrate 600, for example, synthetic quartz is used, and the size thereof is, for example, 4 inch (100 mm) in diameter and 525 μm in thickness. Next, as illustrated in FIG. 15B, for example, titanium oxide film 601 is formed to a thickness of approximately 1,000 nm as a material having high refractive index through which a visible light penetrates, for example, using the spatter method. Thus, a dielectric film forming three-dimensional photonic crystal is formed on the substrate. Next, as illustrated in FIG. 15C, by irradiating the titanium oxide film 601, for example, with a Ga focused ion beam (FIB) while scanning in an in-plane direction of the substrate, an etching mask 602 including a Ga-containing portion is formed on the titanium oxide film 601. At that time, a positioning pattern (not illustrated) is also formed. Irradiation is performed under formation conditions of the etching mask 602 including the Ga-containing portion, for example, an acceleration voltage of 30 kV and a current of 5 nA. The ion dose amount is, for example, $3\times10^{16}$ ions/cm$^2$. At this time, a Ga ion depth distribution peak in the substrate is approximately tens of nm from a surface of titanium oxide film 601.

Figure 15D:
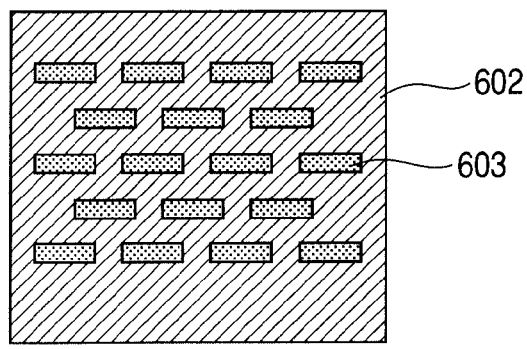
Figure 16E:
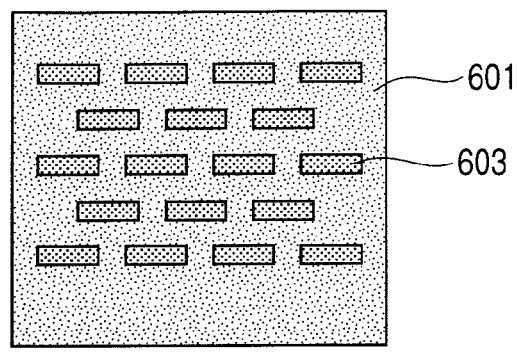
FIGS. 16E, 16F, 16G and 16H are views illustrating a method for fabricating three-dimensional photonic crystalline laser device according to a sixth embodiment of the present invention and illustrating a fabricating process subsequent to the fabricating process of FIGS. 15A, 15B, 15C and 15D.
Figure 16F:
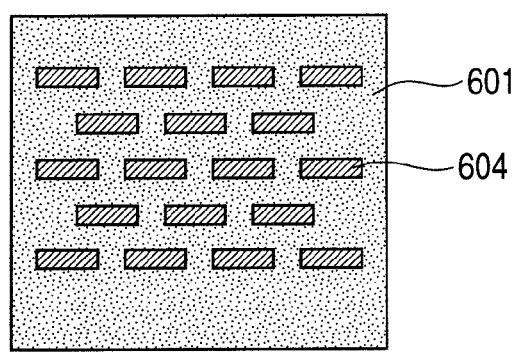

Next, as illustrated in FIG. 15D, the hole forming pattern 603 is formed. At that time, with the mask layer 602 including the Ga-containing portion as a mask, the titanium oxide film 601 is subjected to patterning using reactive ion etching by inductive coupling plasma (ICP). When the longitudinal direction of the mask layer 602 pattern is taken as a right/left direction and the horizontal surface of the substrate 600 is taken as 0 degrees, the hole forming pattern 603 is formed in a direction of 45 degrees obliquely from upward left to downward right. Next, as illustrated in FIG. 16E, the mask layer 602 including the Ga-containing portion on the substrate 600 is removed by etching with hydrochloric acid solution after heat treatment, for example, at a temperature of approximately 600° C. with an oven. Next, as illustrated in FIG. 16F, a sacrificial layer 604 is embedded. This step is the same as for the fourth and the fifth embodiments.

Figure 16G:
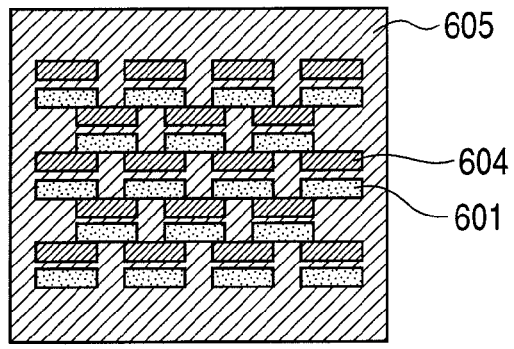
Figure 16H:
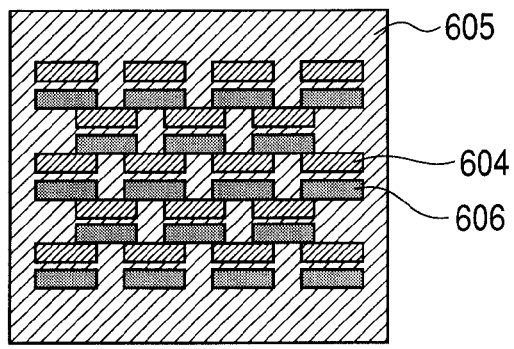

Next, as illustrated in FIG. 16G, by irradiating the titanium oxide 601, for example, with a Ga focused ion beam (FIB) while scanning in an in-plane direction of the substrate, an etching mask 605 including a Ga-containing portion is formed on the titanium oxide 601. Irradiation is performed under formation conditions of the etching mask 605 including the Ga-containing portion, for example, an acceleration voltage of 30 kV and a current of 5 nA. The ion dose amount is, for example, $3\times10^{16}$ ions/cm$^2$. At this time, a Ga ion depth distribution peak in the substrate is approximately tens of nm from a surface of titanium oxide film 601. Layout of the etching mask 605 is different from those in the fourth and the fifth embodiments and the mask forming hole 601 is at a predetermined interval spaced from the hole forming pattern 603. By taking this layout, a rectangular plate structure can be formed at respective intersections of a columnar structure of a woodpile structure described later. The interval corresponds to the thickness of the rectangular plate structure. Next, as illustrated in FIG. 16H, the hole forming pattern 606 is formed. At that time, for example, with a mask layer 605 including Ga-containing portion on titanium oxide film 601 as a mask, the titanium oxide film 601 is subjected to patterning, for example, using reactive ion etching with inductive coupling plasma (ICP). When the longitudinal direction of the mask layer 605 pattern is taken as a right/left direction and the horizontal surface of the substrate 600 is taken as 0 degrees, the titanium oxide hole forming pattern 606 is formed in a direction of 45 degrees obliquely from upward right to downward left. Next, after the mask layer 605 including a Ga-containing portion on the titanium oxide layer 601 is heated to approximately 600° C., for example, with an oven, etching is performed with hydrochloric acid solution to remove the mask. Next, in the hole forming pattern 606 and on the titanium oxide film 601, for example, copper film is formed as a sacrificial layer 604, for example, by an atomic layer deposition method (ALD).

Figure 17I:
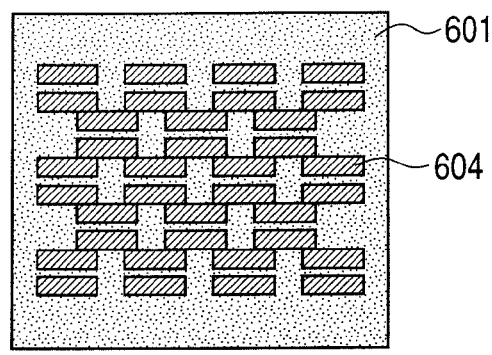
FIGS. 17I, 17J, 17K and 17L are views illustrating a method for fabricating three-dimensional photonic crystalline laser device according to the sixth embodiment of the present invention and illustrating a fabricating process subsequent to the fabricating process of FIGS. 16E, 16F, 16G and 16H.
Figure 17J:
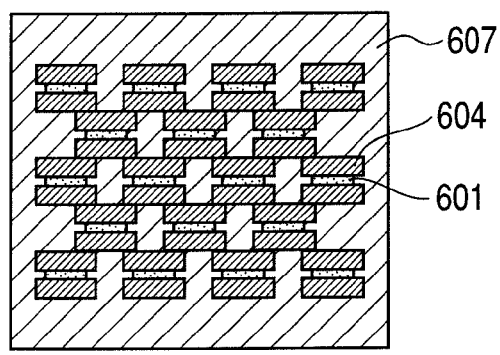

Next, the copper film is polished and flattened until the titanium oxide film 601 is exposed, for example, by chemical-mechanical polishing (CMP), so that the sacrificial layer 604 is embedded into the hole forming pattern 606, as illustrated in FIG. 17I. Next, as illustrated in FIG. 17J, by irradiating the titanium oxide 601, for example, with a Ga focused ion beam (FIB) while scanning in an in-plane direction of the substrate, an etching mask 607 including a Ga-containing portion is formed on the titanium oxide 601. The etching mask 607 can have a shape of a rectangular plate structure described later at respective intersections of a columnar structure in a woodpile structure by hole forming pattern formation performed twice in the next process. The formation conditions of the etching mask 607 including the Ga-containing portion is the same as before.

Figure 17K:
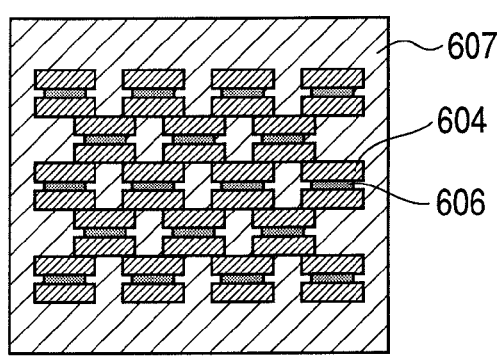
Figure 17L:
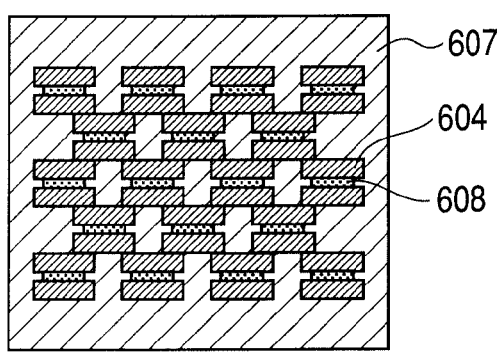

Next, as illustrated in FIG. 17K, the titanium oxide hole forming pattern 606 is formed. At that time, with the mask layer 607 including a Ga-containing portion as a mask, the titanium oxide film 601 is subjected to patterning using reactive ion etching by inductive coupling plasma (ICP). When the longitudinal direction of the mask layer 607 pattern is taken as a right/left direction and the horizontal surface of the substrate 600 is taken as 0 degrees, a titanium oxide hole forming pattern 606 is formed in a direction of 45 degrees obliquely from upward left to downward right. Next, as illustrated in FIG. 17I, the hole forming pattern 608 is formed. At that time, with the mask layer 607 including the Ga-containing portion as a mask, the titanium oxide film 601 is subjected to patterning using reactive ion etching by inductive coupling plasma (ICP). When the longitudinal direction of the mask layer 607 pattern is taken as a right/left direction and the horizontal surface of the substrate 600 is taken as 0 degrees, the hole forming pattern 608 is formed in a direction of 45 degrees obliquely from upward right to downward left. Next, the sacrificial layers 604 in the titanium oxide hole forming patterns 603, 606 are removed by wet etching.

Next, the mask layer 607 including a Ga-containing portion of titanium oxide film 601, after heating to approximately 600° C., for example, with an oven, is subjected to etching in hydrochloric acid solution, so that a three-dimensional photonic crystalline structure made of titanium oxide is formed on the substrate 600, as illustrated in FIG. 18M. FIG. 19N is a sectional view taken along line of 19N-19N in a three-dimensional photonic crystalline structure of FIG. 18M. On the substrate 600, there is formed a three-dimensional photonic crystalline structure 609 having such a shape that a rectangular plate structure is sandwiched between intersections of a columnar structure of a woodpile structure including the titanium oxide 601. As illustrated in FIG. 19O, by focused ion beam processing, for example, by removing a columnar structure of woodpile structure along the columnar structure, the defect portion 611 is formed in the three-dimensional photonic crystalline structure 609. Next, as illustrated in FIG. 19P, as an active portion 611 exhibiting a light-emitting action by light irradiation, quantized dots including GaN, for example, are formed in a defect portion 610 of the three-dimensional photonic crystalline structure 609. For example, by selectively forming quantized dots including GaN by means of the electron beam induced chemical vapor deposition (EB-CVD) method, passive type three-dimensional photonic crystalline laser device can be formed. In the present embodiment, as a patterning method of the titanium oxide film 601, reactive ion etching by inductive coupling plasma (ICP) was used, but reactive ion beam etching or high-speed atomic beam etching may be used.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-128871, filed May 15, 2007, and Japanese Patent Application No. 2008-099991, filed Apr. 8, 2008, which are hereby incorporated by reference herein in their entirety.

What is claimed is:

1. A method for fabricating a three-dimensional structure comprising the steps of:
   preparing a substrate;
   irradiating a focused ion beam onto a surface of the substrate and forming an etching mask including an ion-containing portion in the irradiated region; and
   dry-etching the substrate from a diagonal direction using the etching mask and forming a plurality of holes.

2. The method for fabricating a three-dimensional structure according to claim 1, wherein a focused ion beam with gallium (Ga) ions is used as the focused ion beam in said mask forming step and fluorine-based gas is used for the dry etching in said etching step.

3. The method for fabricating a three-dimensional structure according to claim 1, wherein the three-dimensional structure is a photonic crystal.

4. A method for fabricating a three-dimensional structure comprising the steps of:
   preparing a substrate;
   irradiating a focused ion beam onto a surface of the substrate and forming a first etching mask including an ion-containing portion in the irradiated region;
   dry-etching the substrate from a diagonal direction using the first etching mask and forming a first plurality of holes on the substrate;
   irradiating a focused ion beam onto a surface of the substrate and forming a second etching mask including an ion-containing portion in the irradiated region; and
   dry-etching the substrate so as to intersect with respect to a depth direction of the first plurality of holes using the second etching mask and forming a second plurality of holes.

5. A method for fabricating a three-dimensional structure according to claim 4, wherein a focused ion beam with gallium (Ga) ions is used as the focused ion beam in said first and second mask forming steps and fluorine gas is used for the dry etching in said first and second etching steps.

* * * * *